(12) United States Patent
Yasuda et al.

(10) Patent No.: US 9,109,060 B2
(45) Date of Patent: Aug. 18, 2015

(54) METHOD FOR PRODUCING POLYMER, POLYMER FOR LITHOGRAPHY, RESIST COMPOSITION, AND METHOD FOR PRODUCING SUBSTRATE

(75) Inventors: Atsushi Yasuda, Yokohama (JP);
Tomoya Oshikiri, Yokohama (JP);
Daisuke Matsumoto, Yokohama (JP);
Keisuke Katou, Yokohama (JP);
Shinichi Maeda, Yokohama (JP)

(73) Assignee: Mitsubishi Rayon, Co., Ltd., Tokyo (JP)

( * ) Notice: Subject to any disclaimer, the term of this patent is extended or adjusted under 35 U.S.C. 154(b) by 70 days.

(21) Appl. No.: 13/382,397

(22) PCT Filed: Jul. 7, 2010

(86) PCT No.: PCT/JP2010/061534
§ 371 (c)(1),
(2), (4) Date: Jan. 5, 2012

(87) PCT Pub. No.: WO2011/004840
PCT Pub. Date: Jan. 13, 2011

(65) Prior Publication Data
US 2012/0115086 A1  May 10, 2012

(30) Foreign Application Priority Data

Jul. 7, 2009 (JP) ................................ 2009-160857
Dec. 28, 2009 (JP) ................................ 2009-298029
Dec. 28, 2009 (JP) ................................ 2009-298030

(51) Int. Cl.

| | | |
|---|---|---|
| G03F 7/039 | (2006.01) | |
| C08F 224/00 | (2006.01) | |
| C08F 24/00 | (2006.01) | |
| C08F 297/02 | (2006.01) | |
| C08F 2/00 | (2006.01) | |
| G03F 7/004 | (2006.01) | |
| G03F 7/085 | (2006.01) | |

(52) U.S. Cl.
CPC . C08F 24/00 (2013.01); C08F 2/00 (2013.01); C08F 297/026 (2013.01); *C08F 2500/06* (2013.01); *G03F 7/0045* (2013.01); *G03F 7/0046* (2013.01); *G03F 7/039* (2013.01); *G03F 7/0397* (2013.01); *G03F 7/085* (2013.01)

(58) Field of Classification Search
CPC ................................................. C08F 2500/06
See application file for complete search history.

(56) References Cited

U.S. PATENT DOCUMENTS

| | | | |
|---|---|---|---|
| 5,317,069 A | 5/1994 | Chiang et al. | |
| 6,706,826 B1 * | 3/2004 | Fujiwara et al. | 526/79 |
| 8,455,596 B2 * | 6/2013 | Oikawa et al. | 526/87 |
| 2009/0047602 A1 | 2/2009 | Furuya et al. | |
| 2009/0076230 A1 | 3/2009 | Sheehan et al. | |
| 2010/0248164 A1 | 9/2010 | Kumagai et al. | |
| 2012/0111099 A1 * | 5/2012 | Katou et al. | 73/64.56 |

FOREIGN PATENT DOCUMENTS

| | | |
|---|---|---|
| JP | 10-53620 | 2/1998 |
| JP | 10 274852 | 10/1998 |
| JP | 10 319595 | 12/1998 |
| JP | 2001 201856 | 7/2001 |
| JP | 2002 145955 | 5/2002 |
| JP | 2003-246825 | 9/2003 |
| JP | 2004 269855 | 9/2004 |
| JP | 2005 091407 | 4/2005 |
| JP | 2005 217254 | 8/2005 |
| JP | 2006-36914 | 2/2006 |
| JP | 2007 45922 | 2/2007 |
| JP | 2007-269907 A | 10/2007 |
| JP | 2008-045042 A | 2/2008 |
| JP | 2008-056810 A | 3/2008 |
| JP | 2008 115148 | 5/2008 |
| JP | 2008 239889 | 10/2008 |
| JP | 2009 037184 | 2/2009 |
| JP | 2009 139909 | 6/2009 |
| JP | 2010-513669 | 4/2010 |
| JP | 2010-532807 | 10/2010 |
| JP | 2010-254810 A | 11/2010 |
| JP | 2011-137084 A * | 7/2011 |

(Continued)

OTHER PUBLICATIONS

Chiang et al, Journal of Polymer Science: Part A: Polymer Chemistry, vol. 29 pp. 399-410, year 1991.*
English translation of JP,2008-239889 a, (2008) from machine translation from AIPN Japan Patent Office National Center for Industrial Property Information and Training, generated Oct. 7, 2013, 50 of 50 and 9 of 9 pages.*
English translation of JP 2003-246825 a, (2003) from machine translation from AIPN Japan Patent Office National Center for Industrial Property Information and Training, generated Nov. 4, 2013, 21 pages.*
International Search Report Issued Oct. 19, 2010 in PCT/JP10/061534 Filed Jul. 7, 2010.

(Continued)

*Primary Examiner* — Cynthia Hamilton
(74) *Attorney, Agent, or Firm* — Oblon, McClelland, Maier & Neustadt, L.L.P.

(57) ABSTRACT

A method for producing a polymer is provided. The polymer improves variations in the content ratio and molecular weights of a copolymer's constitutional units, solvent solubility, and the sensitivity of a resist composition using such a polymer. The method includes polymerizing two or more monomers while adding with a polymerization initiator to obtain the polymer, feeding a first solution containing first composition monomers in an initial polymerization stage, and starting dropwise addition of a second solution containing second composition monomers after or simultaneously with the feeding of the first solution. The second composition is equal to a target composition ratio of the polymer to be obtained. The first composition is calculated in advance based on a target composition ratio and the reactivity of the monomers. The above dropping rate is set to high.

6 Claims, 8 Drawing Sheets

(56) References Cited

FOREIGN PATENT DOCUMENTS

| WO | 99 50322 | 10/1999 |
| --- | --- | --- |
| WO | 2005 105869 | 11/2005 |
| WO | WO 2008/082503 A2 | 7/2008 |
| WO | WO 2008/082503 A3 | 7/2008 |
| WO | WO 2009/007155 A1 | 1/2009 |
| WO | WO 2011/004787 A1 * | 1/2011 |

OTHER PUBLICATIONS

International Search Report Issued Jul. 27, 2010 in PCT/JP10/061382 Filed Jul. 5, 2010.

Notice of Reasons for Rejection issued Jul. 9, 2013 in Japanese Patent Application No. 2009-106618 (with English translation).

Office Action issued Nov. 29, 2013 in U.S. Appl. No. 13/967,961.

Office Action issued Nov. 18, 2014 in Japanese Patent Application No. 2009-297800 (with English language translation).

U.S. Office Action mailed Jan. 16, 2015 in co-pending U.S. Appl. No. 13/967,961.

Notice of Allowance issued Feb. 3, 2015 in Japanese Patent Application No. 2009-297800 (with English language translation).

Decision of Rejection issued Jul. 29, 2014 in Japanese patent Application No. 2009-297800 (with English translation).

Murahashi (ed.) et al., "Polymer Chemistry", Chapter3, 3.1, Sep. 2007, 3 pages (with partial English translation).

* cited by examiner

US 9,109,060 B2

METHOD FOR PRODUCING POLYMER, POLYMER FOR LITHOGRAPHY, RESIST COMPOSITION, AND METHOD FOR PRODUCING SUBSTRATE

TECHNICAL FIELD

The present invention relates to a method for producing a polymer, a polymer for lithography obtained by such a production method, a copolymer suitable for lithographic use, a resist composition containing these polymers for lithography, and a method for producing a substrate with a pattern formed using the resist composition.

This application claims priority to Japanese Patent Application No. 2009-160857 filed on Jul. 7, 2009, Japanese Patent Application No. 2009-298029 filed on Dec. 28, 2009, and Japanese Patent Application No. 2009-298030 filed on Dec. 28, 2009, the entire contents of which are incorporated by reference herein.

BACKGROUND ART

In recent years, in processes for manufacturing semiconductors, liquid crystal devices, and the like, rapid progress has been made in formation of a finer pattern using lithography. Examples of technology for formation of a finer pattern include a technology using shorter wave radiation.

In recent years, KrF excimer laser (wavelength: 248 nm) lithographic technology has been introduced. Also, ArF excimer laser (wavelength: 193 nm) lithographic technology and EUV (wavelength: 13.5 nm) lithographic technology, which are intended to use shorter wavelengths, have been investigated.

Furthermore, for example, a so-called chemical amplification type resist has been proposed as a resist compound suitably applicable to shorten the wavelength of irradiation light and to pattern microfabrication. Such a chemical amplification type resist includes a polymer, which becomes soluble in alkali when an acid-eliminable group is dissociated by the action of an acid, and a photoacid generator. The resist composition has been further developed and improved.

An acrylic type polymer transparent to light with a wavelength of 193 nm has attracted attention as a chemical amplification resist polymer used in ArF excimer laser lithography.

For example, copolymers for lithography as described in Patent Document 1 below are produced using, as monomers, (A) a (meth)acrylate to which an aliphatic hydrocarbon having a lactone ring is ester-bonded, (B) a (meth)acrylate to which a group dissociable by the action of an acid is ester-bonded, and (C) a (meth)acrylate to which a hydrocarbon group or an oxygen atom-containing heterocyclic group having a polar substituent is ester-bonded.

In general, furthermore, a (meth)acrylate polymer is obtained by radical polymerization. Generally, in a multi-component polymer made of two or more monomers, the monomers differ in copolymerization reaction ratio. Thus, the copolymer composition ratio of the polymers in the initial stage is different from that in the last stage. Namely, the obtained polymer resultantly has a composition distribution.

When a polymer has variations in the composition ratio of constitutional units, the solubility of the copolymer tends to be less in a solvent. Thus, the preparation of a resist composition may be affected. For example, preparation of a resist composition takes a long time to dissolve the copolymer in a solvent, and causes an increase in the number of production steps due to generation of an insoluble substance. Also, the obtained resist composition tends to have insufficient sensitivity.

On the other hand, for example, a method for obtaining a polymer having a narrow copolymer composition distribution as described in Patent Document 2 below makes a difference between the feed rate of a monomer having a relatively higher polymerization rate to a monomer having a lower polymerization rate in the front end of the process and that in the back end of the process to obtain a resist having high resolution.

Also, a trace amount of a macromolecular component (high polymer) generated in the polymerization process may cause a decrease in the solubility of a polymer for lithography in a resist solvent as well as in an alkali developing solution. As a result, the sensitivity of a resist composition is decreased.

In Patent Document 3 below, a method of limiting the generation of such a polymer is proposed. In this method, a solution containing a polymerizable monomer and a solution containing a polymerization initiator are respectively held in separate reservoirs. Then, the polymerization initiator is fed earlier than the polymerizable monomer to a polymerization system.

On the other hand, attention has been focused on an acrylic type polymer transparent to light having a wavelength of 193 nm as a chemical amplification-type resist to be used in ArF excimer laser lithography. For example, a copolymer of a (meth)acrylate having an adamantine skeleton in the ester part and a (meth)acrylate having a lactone skeleton in the ester part as the above acrylic type polymer (for example, Patent Documents 4 and 5).

Incidentally, a (meth)acrylate polymer is obtained by radical polymerization. In a multi-component polymer produced from two or more types of monomers, the monomers have their respective copolymerization reaction rates. Thus, the copolymer composition ratio of the polymer in the initial stage is different from that in the last polymerization stage. Namely, the resulting polymer has a composition distribution. A copolymer having such a composition distribution tends to deteriorate resist performance. Therefore, studies have been made to control the composition distribution of a copolymer.

For example, from the viewpoint of solubility in solvent, Patent Document 6 describes that the content (mol %) of a constitutional unit derived from a (meth)acrylate monomer having a lactone skeleton in each copolymer contained in 10 to several tens of fractions obtained by dividing a copolymer solution by gel permeation chromatography (hereinafter referred to as "GPC") is preferably within −10 to +10 mol % of the average content of a constitutional unit derived from a (meth)acrylate monomer having a lactone skeleton in the whole copolymers.

Also, from the viewpoint of the formation of a finer pattern in semiconductor lithography, Patent Document 7 describes that the molar composition of a constitutional unit having a hydroxyl group in a low-molecular-weight region corresponding to 5% of the peak of all copolymer in GPC is preferably within ±10% of the average molar composition of a constitutional unit having a hydroxyl group in all copolymer.

CITATION LIST

Patent Literature

Patent Document 1: JP-A-2002-145955
Patent Document 2: JP-A-2001-201856

Patent Document 3: JP-A-2004-269855
Patent Document 4: JP-A-H10-319595
Patent Document 5: J JP-A-H10-274852
Patent Document 6: PCT International Publication WO 1999/050322
Patent Document 7: PCT International Publication WO 2005/105869

DISCLOSURE OF THE INVENTION

Problems to be Solved by the Invention

However, the methods described in the above Patent Documents 2 and 3 may insufficiently improve the solubility of a polymer for lithography or the sensitivity of a resist composition.

The present invention has been made in consideration of the above situation. An object of the present invention is to provide a method for producing a polymer, whereby the method is able to improve a variation in the content and molecular weight of a constitutional unit in a copolymer, while improving the solubility of the copolymer to a solvent and the sensitivity thereof when it is used for a resist composition; a polymer for lithography obtained by the production method; a resist composition containing the polymer for lithography; and a method for producing a substrate with a pattern formed thereon by using the resist composition.

Also, in the conventional methods as described in the above Patent Documents 6 and 7, the solubility of a copolymer in a solvent is not sufficient. Therefore, further improvement in the solubility of a copolymer in a solvent has been desired.

In the case of, for example, a copolymer for semiconductor lithography, some disadvantages occur when preparing a composition for semiconductor lithography if the solubility of a copolymer is insufficient. For example, a long time is taken to dissolve the copolymer in a solvent. Also, generation of insoluble substances leads to an increase in the number of production steps.

Solution to the Problems (1) In order to solve the above problem, a first aspect of the present invention relates to a polymerization method in which two or more types of monomers $\alpha_1$ to $\alpha_n$ (wherein n denotes an integer of 2 or more) are polymerized while the monomers and a polymerization initiator are added dropwise to a reactor to obtain a copolymer (P) constituted of constitutional units $\alpha'_1$ to $\alpha'_n$ (wherein $\alpha'_1$ to $\alpha'_n$ represent constitutional units derived from the monomers $\alpha_1$ to $\alpha_n$ respectively), the method comprising the following two steps (I) and (II).

(I) A step of feeding a first solution containing the monomers $\alpha_1$ to $\alpha_n$ in a first composition ratio in a reactor before a polymerization initiator is added dropwise or simultaneously with the start of the dropwise addition of the polymerization initiator, wherein proportions of the monomers $\alpha_1$ to $\alpha_n$ in the first composition ratio are those that enable the monomers $\alpha_1$ to $\alpha_n$ to be reacted in a steady state from the initial stage of polymerization based on the reaction rate of each monomer.

(II) A step of feeding a second solution to the reactor after the feeding of the first solution is started or simultaneously with the start of the feeding of the first solution. When the ratio (hereinafter referred to as "target composition ratio") (unit:mol %) of the constitutional units $\alpha'_1$ to $\alpha'_n$ in the polymer (P) to be obtained is $\alpha'_1:\alpha'_2:\ldots:\alpha'_n$, the second solution contains the monomers $\alpha'_1$ to $\alpha'_n$ having the same composition ratio.

(2) In the polymerization method according to the first aspect, the first composition ratio is determined on the basis of the following procedures (i) to (iii).

(i) First, a dropping solution containing 100 parts by mass of a monomer mixture having the same monomer composition ratio as the target composition ratio, $\alpha'_1:\alpha'_2:\ldots:\alpha'_n$, a polymerization initiator and a solvent are added dropwise to a reactor only containing a solvent at a fixed dropping rate. Then, the composition ratio (unit:mol %), $M_1:M_2:\ldots:M_n$, of the monomers $\alpha_1$ to $\alpha_n$ left in the reactor is determined at each of times $t_1, t_2, t_3 \ldots$, and $t_m$ passed from the start of the dropwise addition. In addition, a ratio (mol %) of $P_1:P_2:\ldots:P_n$ of the constitutional units $\alpha'_1$ to $\alpha'_n$ in each of polymers which are produced between the time $t_1$ to the time $t_2$, between the time $t_2$ to the time $t_3, \ldots$, and between the time $t_m$ to the time $t_{m+1}$ is calculated.

(ii) A time zone from $t_m$ to $t_{m+1}$ (m represents an integer of 1 or more) when the ratio $P_1:P_2:\ldots:P_n$ becomes nearer to the target composition ratio $\alpha'_1:\alpha'_2:\ldots:\alpha'_n$ is determined.

(iii) Factors $F_1, F_2, \ldots$, and $F_n$ are determined from the value of $P_1:P_2:\ldots:P_n$ between $t_m$ and $t_{m+1}$ and the value of $M_1:M_2:\ldots:M_n$ at the passage of time $t_m$ according to the equations $F_1=P_1/M_1$, $F_2=P_2/M_2, \ldots$, and $F_n=P_n/M_n$.

As to $F_1, F_2, \ldots$, and $F_n$, the factors calculated according to the above procedures (i) to (iii) are represented by $F_1, F_2, \ldots$, and $F_n$, and $\alpha_1=\alpha'_1/F_1$, $\alpha_2=\alpha'_2/F_2, \ldots$, $\alpha_n=\alpha'_n/F_n$.

(3) The method for producing a polymer according to the first aspect includes a polymerization step in which two or more types of monomers $\alpha_1$ to $\alpha_n$ (wherein n denotes an integer of 2 or more) are polymerized while the monomers and a polymerization initiator are added dropwise to a reactor to obtain a polymer (P) constituted of constitutional units $\alpha'_1$ to $\alpha'_n$ (wherein $\alpha'_1$ to $\alpha'_n$ represent constitutional units derived from the monomers $\alpha_1$ to $\alpha_n$ respectively).

The feeding of the first solution containing the monomers $\alpha_1$ to $\alpha_n$ in a first composition ratio to the reactor is started before the polymerization initiator is added dropwise or simultaneously with the start of the dropwise addition of the polymerization initiator.

The dropwise addition of the second solution containing the monomers $\alpha_1$ to $\alpha_n$ in a second composition ratio to the reactor is started after the feeding of the first solution is started or simultaneously with the start of the feeding of the first solution.

The dropwise addition of the second solution is started simultaneously with the start of dropwise addition of the polymerization initiator or after the start of the dropwise addition of the polymerization initiator.

Here, when the ratio (unit:mol %) of the constitutional units $\alpha'_1$ to $\alpha'_n$ in the polymer (P) to be obtained is the same as $\alpha'_1:\alpha'_2:\ldots:\alpha'_n$, the second composition ratio is the same as the target composition ratio.

In addition, $\alpha_1:\alpha_2:\ldots:\alpha_n$ represents the first composition ratio and $F_1, F_2, \ldots$, and $F_n$ represent factors represented by $\alpha_1=\alpha'_1/F_1$, $\alpha_2=\alpha'_2/F_2, \ldots$, and $\alpha_n=\alpha'_n/F_n$. which are calculated according to the following procedures (ii) to (iii).

When the passage of time since the dropwise addition of the polymerization initiator is started until the dropwise addition of the second solution is stopped is defined as a standard time, the feeding of the first solution is completed before 20% of the standard time passes.

Furthermore, the polymerization initiator is fed in an amount of 30 to 90% by mass of the total feed amount thereof during a high-rate feeding period.

The high-rate feeding period is a period range from 0% to j % (j is 5 to 20) of the standard time, during which period the polymerization initiator is added dropwise at a rate higher than the average feed rate.

The average feed rate is a value obtained by dividing the total feed amount of the polymerization initiator by the standard time.

The above procedures (i) to (iii) are as follows:

(i) First, a dropping solution containing 100 parts by mass of a monomer mixture having the same monomer composition ratio as the target composition ratio, $\alpha'_1:\alpha'_2:\ldots:\alpha'_n$, a polymerization initiator and a solvent are added dropwise to a reactor only containing a solvent at a fixed dropping rate; then, the composition ratio (unit:mol %), $M_1:M_2:\ldots:M_n$, of the monomers $\alpha_1$ to $\alpha_n$ left in the reactor is determined at each of times $t_1, t_2, t_3 \ldots$, and $t_m$ passed from the start of the dropwise addition. In addition, a ratio (mol %) of $P_1:P_2:\ldots:P_n$ of the constitutional units $\alpha'_1$ to $\alpha'_n$ in each of polymers which are produced between the time $t_1$ to the time $t_2$, between the time $t_2$ to the time $t_3$, ..., and between the time $t_m$ to the time $t_{m+1}$ is calculated.

(ii) A time zone from $t_m$ to $t_{m+1}$ when the ratio $P_1:P_2:\ldots:P_n$ becomes nearer to the target composition ratio $\alpha'_1:\alpha'_2:\ldots:\alpha'_n$ is determined (m is an integer of 1 or more).

(iii) Factors $F_1, F_2, \ldots$, and $F_n$ are determined from the value of $P_1:P_2:\ldots:P_n$ between $t_m$ and $t_{m+1}$ and the value of $M_1:M_2:\ldots:M_n$ at the passage of time $t_m$ according to the equations $F_1=P_1/M_1, F_2=P_2/M_2, \ldots$, and $F_n=P_n/M_n$.

(4) A second aspect of the present invention relates to a copolymer for lithography, whereby the copolymer is obtained by the above production method.

Also, in view of the above problem, the inventors of the present invention have made earnest studies as to the solubility of a copolymer. As a result, the inventors of the present invention have found that the solubility of a copolymer in a solvent is further improved when there is a variation in, particularly, the monomer composition of the copolymer in a high-molecular-weight region of a multi-component polymer produced from two or more types of monomers, to complete the present invention.

(5) Therefore, a third aspect of the present invention relates to a copolymer for lithography that is obtained by polymerizing two or more types of monomers. Among fractions obtained by dividing an eluate showing peaks relative to the above copolymer in an elution curve obtained by gel permeation chromatography into eight fractions in order of fractionation such that each fraction has the same volume, a difference between the monomer composition ratio of a copolymer contained in a first eluted fraction and the monomer composition ratio of all copolymers is −3 mol % to +3 mol % in any of the constitutional units derived from the respective monomers.

(6) A copolymer for lithography described in the above (4) or (5) may be used for a resist.

(7) A fourth aspect of the present invention relates a resist composition containing the above copolymer for lithography and a compound that generates an acid when irradiated with active rays or radial rays.

(8) A fifth aspect of the present invention relates to a method for producing a substrate with a pattern formed thereon. The method includes the steps of applying the above resist composition to the surface of a substrate to form a resist film, exposing the resist film to light, and developing the exposed resist film by using a developing solution.

Effects of the Invention

According to the above production method, a copolymer can be obtained which can improve a variation in the ratio of a constitutional unit and a variation in molecular weight of the constitutional unit and can also improve the solubility thereof in a solvent and the sensitivity thereof when used as a resist composition.

A variation in the ratio of a constitutional unit of the copolymer for lithography and a variation in molecular weight of the constitutional unit are improved. Also, the copolymer for lithography has good solubility in a solvent. Also, high sensitivity is obtained by formulating the copolymer for lithography in a resist composition.

Also, the above copolymer for lithography is reduced in a variation in the monomer composition of the copolymer in a high-molecular-weight region. Also, the copolymer for lithography has good solubility in a solvent. Also, high sensitivity is obtained by formulating the copolymer for lithography in a resist composition.

The above resist composition is a chemical amplification type. Also, the solubility of the copolymer in a resist solvent is good. Thus, the content of insoluble materials in the composition is small. Also, the above resist composition has excellent sensitivity.

According to the above method for producing a substrate, a highly precise and fine resist pattern reduced in defects can be formed stably.

DESCRIPTION OF EMBODIMENTS

Figure 1:
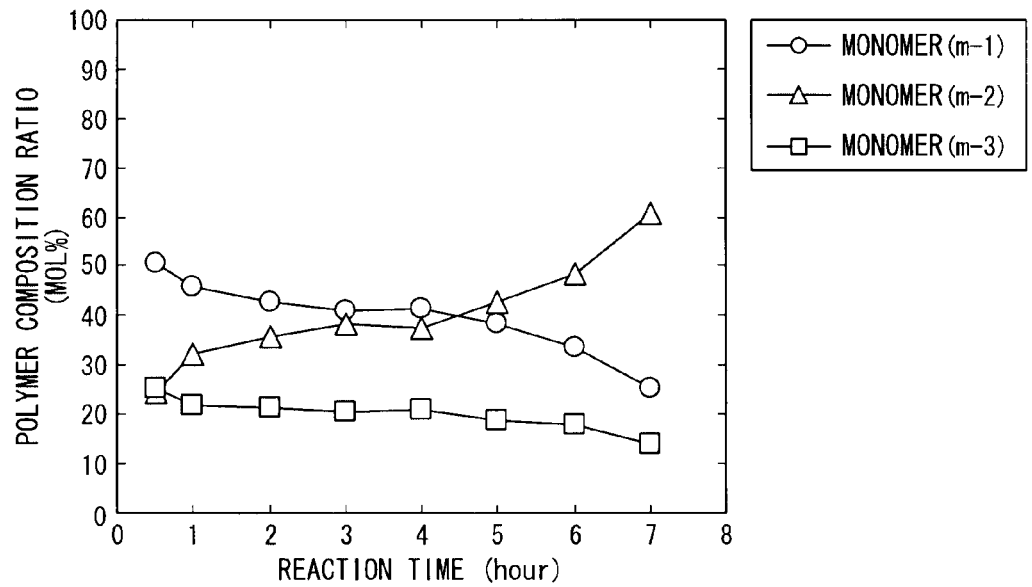
FIG. 1 is a graph representing the results of Reference Example 1.

In this specification, the term "(meth)acrylic acid" means acrylic acid or methacrylic acid. The term "(meth)acryloyloxy" means acryloyloxy or methacryloyloxy.

In this specification, the weight-average molecular weight (Mw) and molecular weight distribution (Mw/Mn) of polymer are those in terms of polystyrene measured by gel permeation chromatography.

In this specification, the copolymer means a copolymer obtained by polymerizing two or more types of monomers $\alpha_1$ to $\alpha_n$ (wherein n denotes an integer of 2 or more) and constructed of constitutional units $\alpha'_1$ to $\alpha'_n$ (wherein $\alpha'_i$ represents a constitutional unit derived from the monomer $\alpha_i$, i denotes an integer from 2 to n, and n denotes an integer of 2 or more). The monomer composition ratio of the copolymer means the ratio (unit:mol %) of each constitutional unit based on all constitutional units of the copolymer.

In this specification, the copolymer for lithography is, for example, a copolymer for resist and a copolymer for an anti-reflection film. The copolymer for lithography is suitable to use for lithography.

(Production Method)
<Polymer (P)>

The polymer (P) in the present invention is composed of constitutional units $\alpha'_1$ to $\alpha'_n$ (wherein $\alpha'_1$ to $\alpha'_n$ represent constitutional units derived from the monomers $\alpha_1$ to $\alpha_n$ and n denotes an integer of 2 or more). Here, n is preferably 6 or less from the point that the advantageous effects of the present invention can be easily obtained. In addition, n is more preferably 5 or less and even more preferably 4 or less when the polymer (P) is a resist polymer.

When, for example, n=3, the polymer (P) is a ternary polymer P ($\alpha'_1/\alpha'_2/\alpha'_3$) constituted of constitutional units $\alpha'_1$, $\alpha'_2$ and $\alpha'_3$. When n=4, the polymer (P) is a quaternary polymer P ($\alpha'_1/\alpha'_2/\alpha'_3/\alpha'_4$) constituted of constitutional units $\alpha'_1$, $\alpha'_2$, $\alpha'_3$ and $\alpha'_4$.

There is no particular limitation to the use of the above polymer (P). For example, the above polymer (P) is preferably a polymer for lithography that is used in a lithographic step. Examples of the polymer for lithography include a resist polymer, polymer for an antireflection film that is used for forming an antireflection film (TARC) formed on the topside of a resist film or antireflection film (BARC) formed on the backside of a resist film, polymer for a gap-fill film used for forming a gap-fill film, and polymer for a topcoat film used for forming a topcoat film.

The weight-average molecular weight (Mw) of the polymer for lithography is preferably 1,000 to 200,000, and more preferably 2,000 to 40,000. The distribution of molecular weight (Mw/Mn) is preferably 1.0 to 10.0 and more preferably 1.1 to 4.0.

There is no particular limitation to the constitutional unit of the polymer (P) and the constitutional unit is suitably selected according to use and requirements.

When the above polymer is a resist copolymer, the above polymer preferably has a constitutional unit having an acid-dissociable group. When the above polymer is a resist polymer, the above polymer may have known constitutional units such as a constitutional unit having a lactone skeleton and a constitutional unit having a hydrophilic group according to the need. The weight-average molecular weight (Mw) of the polymer (P) for a resist is preferably 1,000 to 100,000 and more preferably 3,000 to 30,000. The distribution of molecular weight (Mw/Mn) is preferably 1.0 to 3.0 and more preferably 1.1 to 2.5.

The polymer for an antireflection film preferably has a constitutional unit having, for example, a light-absorbing group. This polymer preferably has a constitutional unit having a functional group that is curable by reaction with a curing agent and the like to avoid mixing of the resist film with the polymer for an antireflection film. Examples of this reactive functional group include an amino group, an amide group, a hydroxyl group, and an epoxy group.

The light-absorbing group is a group having high ability to absorb light that can sensitize light-sensitive components in the resist composition and has a wavelength falling in a prescribed wavelength range. Specific examples of the light-absorbing group include a group having a ring structure (may have optional substituents) such as an anthracene ring, a naphthalene ring, a benzene ring, a quinoline ring, a quinoxaline ring, and a thiazole ring. When KrF laser light is used as the radiation light, the light-absorbing group is preferably an anthracene ring or anthracene rings having optional substituents. When ArF laser light is used as the radiation light, the light-absorbing group is preferably a benzene ring or benzene rings having optional substituents.

Examples of the above optional substituent include a phenolic hydroxyl group, alcoholic hydroxyl group, carboxyl group, carbonyl group, ester group, amino group, or amide group.

Particularly, a polymer for an antireflection film which contains a protective or non-protective phenolic hydroxyl group as this substituent is preferable from the viewpoint of obtaining good developing characteristics and high resolution.

Examples of the constitutional unit/monomer having the above light-absorbing group include benzyl(meth)acrylate and p-hydroxyphenyl(meth)acrylate.

The polymer for a gap-fill film preferably has a suitable viscosity allowing it to flow into a narrow gap. Moreover, the polymer for a gap-fill film preferably has a constitutional unit having a reactive functional group that is curable by reacting with a curing agent to avoid the mixing of the gap-fill film polymer with the resist film or antireflection film.

Specific examples of the polymer for a gap-fill film include copolymers of hydroxystyrene and monomers such as styrene, alkyl(meth)acrylate and hydroxyalkyl(meth)acrylate.

Examples of the polymer for a topcoat film that is used for immersion lithography include copolymers containing a constitutional unit having a carboxyl group and copolymers containing a constitutional unit having a fluorine-containing group substituted with a hydroxyl group.

<Constitutional Unit/Monomer>

The polymer (P) is obtained by polymerizing monomers $\alpha_1$ to $\alpha_n$ corresponding to constitutional units $\alpha'_1$ to $\alpha'_n$. The monomer is preferably a compound having a vinyl group. The monomer is preferably a compound that is radically polymerized with ease. Particularly, (meth)acrylate has high transparency to exposure light having a wavelength of 250 nm or less.

Hereinafter, constitutional units and monomers corresponding to the constitutional units when the polymer (P) is a resist polymer are described.

(Constitutional Unit/Monomer Having an Acid-Eliminable Group)

The resist polymer preferably has an acid-eliminable group. The term "acid-eliminable group" used herein is a group having a bond cleaved by the action of an acid. Some or all of the acid-eliminable groups are eliminated from the main chain of the polymer by the above cleavage of the bond.

In the composition for a resist, the polymer having a constitutional unit having an acid-eliminable group reacts with an acid component to be soluble in an alkaline solution, thereby contributing the formation of a resist pattern.

The proportion of the constitutional unit having an acid-eliminable group based on all constitutional unit (100 mol %) constituting the polymer is preferably 20 mol % or more and more preferably 25 mol % or more from the viewpoint of sensitivity and resolution. This proportion is preferably 60 mol % or less, more preferably 55 mol % or less, and even more preferably 50 mol % or less from the viewpoint of adhesion to a substrate or the like.

Any monomer may be used as the monomer having an acid-eliminable group as long as it has an acid-eliminable group and a polymerizable multiple bond. A known compound may be used as the monomer having an acid-eliminable group. The polymerizable multiple bond means a multiple bond which is cleaved in a polymerization reaction to form a copolymer chain. The polymerizable multiple bond is preferably an ethylenic double bond.

Specific examples of the monomer having an acid eliminable group include (meth)acrylates having an aliphatic hydrocarbon group having 6 to 20 carbon atoms and an acid-dissociable group. The above aliphatic hydrocarbon group may be connected to an oxygen atom constituting the ester bond of the (meth)acrylate either directly or through a connecting group such as an alkylene group.

The above (meth)acrylate has, for example, an aliphatic hydrocarbon group having 6 to 20 carbon atoms. Also, the (meth)acrylate is, for example, a (meth)acrylate having a tertiary carbon atom at the position where it is bonded with an oxygen atom constituting an ester bond, or a (meth)acrylate containing an aliphatic hydrocarbon group having 6 to 20 carbon atoms which is bonded to a —COOR group (R represents a tertiary hydrocarbon group, a tetrahydrofuranyl group, a tetrahydropyranyl group, or an oxepanyl group, which may have a substituent) directly or through a connecting group.

When, particularly, a resist composition to be applied to a pattern formation method using light having a wavelength of 250 nm or less to expose is produced, preferable examples of the monomer containing an acid-eliminable group include 2-methyl-2-adamantyl(meth)acrylate, 2-ethyl-2-adamantyl (meth)acrylate, 1-(1'-adamantyl)-1-methylethyl(meth)acrylate, 1-methylcyclohexyl(meth)acrylate, 1-ethylcyclohexyl (meth)acrylate, 1-methylcyclopentyl(meth)acrylate, 2-ethylcyclopentyl(meth)acrylate, 2-isopropyl-2-adamantyl (meth)acrylate, and 1-ethylcyclooctyl(meth)acrylate.

Among these compounds, 1-ethylcyclohexylmethacrylate (m-2 in Examples), 2-methyl-2-adamantylmethacrylate (m-5 in Examples), 1-ethylcyclopentylmethacrylate and 2-isopropyl-2-adamantylmethacrylate are more preferable. The constitutional unit having an acid-eliminable group may be used singly or in combination of two or more, as necessary.

(Constitutional Unit/Monomer Having Polar Group)

The term "polar group" is a group having a polar functional group or a polar atomic group. Specific examples of the "polar group" include a hydroxy group, a cyano group, an alkoxy group, a carboxyl group, an amino group, a carbonyl group, a fluorine atom-containing group, a sulfur atom-containing group, a lactone skeleton-containing group, an acetal structure-containing group, and an ether bond-containing group.

Among these groups, the resist polymer to be applied to a pattern formation method using light having a wavelength of 250 nm or less to expose preferably has a constitutional unit having a lactone skeleton. Moreover, the resist polymer preferably has a constitutional unit having a hydrophilic group that will be described later.

(Constitutional Unit/Monomer Having Lactone Skeleton)

Examples of the lactone skeleton include lactone skeletons having about a 4- to 20-membered ring. The lactone skeleton may be a single ring only containing a lactone ring or may contain a lactone ring and an aliphatic or aromatic carbon ring or hetero-ring condensed with the lactone ring.

When the copolymer contains a constitutional unit having a lactone skeleton, the content of the constitutional unit is preferably 20 mol % and more preferably 35 mol % or more based on all constitutional units (100 mol %) from the viewpoint of adhesion to, for example, the substrate. Also, the content is preferably 60 mol % or less, more preferably 55 mol % or less and even more preferably 50 mol % or less from the viewpoint of sensitivity and resolution.

The monomer having a lactone skeleton is preferably at least one type selected from the group consisting of meth-acrylates having a substituted or unsubstituted δ-valerolactone and monomers having a substituted or unsubstituted γ-butyrolactone ring, and more preferably a monomer having an unsubstituted γ-butyrolactone ring.

Specific examples of the monomer having a lactone skeleton include β-(meth)acryloyloxy-β-methyl-δ-valerolactone, 4,4-dimethyl-2-methylene-γ-butyrolactone, β-(meth) acryloyloxy-γ-butyrolactone, β-(meth)acryloyloxy-β-methyl-γ-butyrolactone, α-(meth)acryloyloxy-γ-butyrolactone, 2-(1-(meth)acryloyloxy)ethyl-4-butanolide, pantoyllactone (meth)acrylate, 5-(meth)acryloyloxy-2,6-norbornanecarbolactone, 8-methacryloxy-4-oxatricyclo [5.2.1.0$^{2,6}$]decan-3-one, and 9-methacryloxy-4-oxatricyclo [5.2.1.0$^{2,6}$]decan-3-one. Also, examples of a monomer having an analogous structure include methacryloyloxysuccinic acid anhydride.

Among these compounds, α-methacryloyloxy-γ-butyrolactone (m-1 in Examples), α-acryloyloxy-γ-butyrolactone (m-4 in Examples), 5-metacryloyloxy-2,6-norbornanecarbolactone, and 8-methacryloxy-4-oxatricylo[5.2.1.0$^{2,6}$]decan-3-one are more preferable.

One type of monomer having a lactone skeleton may be singly used. Two or more types of monomers having a lactone skeleton may be combined upon use.

(Constitutional Unit/Monomer Having Hydrophilic Group)

The term "hydrophilic group" in this specification means at least one type among —C(CF$_3$)$_2$—OH, hydroxy group, cyano group, methoxy group, carboxyl group, and amino group.

Among these groups, the resist polymer which is applied to the pattern formation method using light having a wavelength of 250 nm or less to expose preferably has a hydroxy group or cyano group as the hydrophilic group.

The content of the constitutional unit having a hydrophilic group in the copolymer based on all constitutional units (100 mol %) is preferably 5 to 30 mol % and more preferably 10 to 25 mol % from the viewpoint of the rectangularity of a resist pattern.

Examples of the monomer having a hydrophilic group include: (meth)acrylates having a terminal hydroxy group; derivatives having a substituent, such as an alkyl group, a hydroxy group, or a carboxyl group, on a hydrophilic group of a monomer; and monomers having a cyclic hydrocarbon group (for example, cyclohexyl(meth)acrylate, 1-isobornyl (meth)acrylate, tricyclodecanyl(meth)acrylate, dicyclopentyl (meth)acrylate, 2-methyl-2-adamantyl(meth)acrylate, and 2-ethyl-2-adamantyl(meth)acrylate) and having a hydrophile group, such as a hydroxy group or a carboxyl group, as a substituent.

Specific examples of the monomer having a hydrophilic group include a (meth)acrylic acid, 2-hydroxyethyl(meth) acrylate, 3-hydroxypropyl(meth)acrylate, 2-hydroxy-n-propyl(meth)acrylate, 4-hydroxybutyl(meth)acrylate, 3-hydroxyadamantyl(meth)acrylate, 2- or 3-cyano-5-norbornyl (meth)acrylate, and 2-cyanomethyl-2-adamantyl(meth) acrylate. Among them, 3-hydroxyadamantyl(meth)acrylate, 2- or 3-cyano-5-norbornyl(meth)acrylate, and 2-cyanomethyl-2-adamantyl(meth)acrylate are preferable from the viewpoint of adhesion to the substrate.

Among these compounds, 3-hydroxyadamantyl(meth) acrylate (m-3 in Examples) and 2-cyanomethyl-2-adamantyl (meth)acrylate (m-6 in Example) are more preferable.

These monomers having a hydrophilic group may be used either singly or in combinations of two or more.

(Constitutional Unit Having Structure that Absorbs Radial Rays)

When the copolymer of the present invention is a polymer for an antireflection film, it is necessary that the copolymer contain a molecular structure that absorbs radial rays applied in a lithographic step.

The structure that absorbs radial rays differs depending on the wavelength of the radial rays to be used. The structure absorbing radial rays is preferably a naphthalene skeleton and anthracene skeleton to KrF excimer laser light. The structure absorbing radial rays is preferably a benzene skeleton to ArF excimer laser light.

Examples of the monomer providing constitutional units having these molecular structures may include styrenes such as styrene, α-methylstyrene, p-methylstyrene, p-hydroxystyrene, and m-hydroxystyrene and their derivatives, and aromatic group-containing esters having an ethylenic double bond such as substituted or unsubstituted phenyl(meth)acrylates, substituted or unsubstituted naphthalene(meth)acrylates, and substituted or unsubstituted anthracenemethyl (meth)acrylate.

The proportion of the constitutional unit having a molecular structure absorbing radial rays based on all constitutional units (100 mol %) of the copolymer is preferably 10 to 100 mol %.

<Polymerization Initiator>

Polymerization initiators, which are decomposed by heat to generate radicals efficiently, are preferable. It is also preferable to use a polymerization initiator having a ten-hour half-life temperature lower than the polymerization temperature. When, for example, a polymer for lithography is produced, the polymerization temperature is preferably 50 to 150° C. Also, when a polymer for lithography is produced, it is preferable to use a polymerization initiator having a ten-hour half-life temperature of 50 to 70° C.°. In order that the polymerization initiator be decomposed efficiently, the difference between the ten-hour half-life temperature and polymerization temperature of the polymerization initiator is preferably 10° C. or more.

Examples of the polymerization initiator include azo compounds such as 2,2'-azobisisobutyronitrile, dimethyl-2,2'-azobisisobutylate, 2,2'-azobis(2,4-dimethylvaleronitrile), and 2,2'-azobis[2-(2-imidazoline-2-yl)propane and organic peroxides such as 2,5-dimethyl-2,5-bis(tert-butylperoxy)hexane, and di(4-tert-butylcyclohexyl)peroxydicarbonate. Azo compounds are more preferable.

These compounds are available as commercial products. For example, dimethyl-2,2'-azobisisobutylate (trade name: V601, manufactured by Wako Pure Chemical Industries Ltd., ten-hour half-life temperature: 66° C.) and 2,2'-azobis(2,4-dimethylvaleronitrile (trade name: V65, manufactured by Wako Pure Chemical Industries Ltd., ten-hour half-life temperature: 51° C.) may be preferably used.

<Solvent>

A polymerization solvent may be used in the method for producing a polymer according to the present invention. For example, any one of the following polymerization solvents may be used.

Ethers: chain ether (for example, diethyl ether and propylene glycol monomethyl ether), cyclic ethers (for example, tetrahydrofuran (hereinafter referred to as "THF" where necessary), 1,4-dioxane and the like.

Esters: methyl acetate, ethyl acetate, butyl acetate, ethyl lactate, butyl lactate, propylene glycol monomethyl ether acetate (hereinafter referred to as "PGMEA" where necessary), γ-butyrolactone and the like.

Ketones: acetone, methyl ethyl ketone, methyl isobutyl ketone and the like.

Amides: N,N-dimethylacetamide, N,N-dimethylformamide and the like.

Sulfoxides: dimethylsulfoxide and the like.

Aromatic hydrocarbons: Benzene, toluene, xylene and the like.

Aliphatic hydrocarbons: hexane and the like.

Alicyclic hydrocarbons: cyclohexane and the like.

One type of polymerization solvent may be singly used. Also, two or more types of polymerization solvents may be combined prior to use.

The amount of the polymerization solvent is, for example, preferably such an amount that the solid content of a solution (polymerization reaction solution) in a reactor is about 20 to 40% by mass when the polymerization reaction is completed, though no particular limitation is imposed on the amount.

<Method for Producing a Polymer>

A method for producing a polymer comprises a polymerization step in which two or more types of monomers $\alpha_1$ to $\alpha_n$ are polymerized while the monomers and a polymerization initiator are added dropwise to a reactor to obtain a polymer (P) constituted of constitutional units $\alpha'_1$ to $\alpha'_n$ (wherein $\alpha'_1$ to $\alpha'_n$ represent constitutional units derived from the monomers $\alpha_1$ to $\alpha_n$ respectively). The polymerization step is performed by the radical polymerization method. In the present invention, the dropping polymerization method is used in which the monomers are polymerized while the monomers and a polymerization initiator are added dropwise to a reactor.

In the present invention, a first solution containing the monomers $\alpha_1$ to $\alpha_n$ in a first composition ratio and a second solution containing the monomers $\alpha_1$ to $\alpha_n$ in a second composition ratio are used as solutions containing monomers. The first and second solutions each preferably have a solvent.

(Second Solution)

The ratio of the contents (second composition ratio) of the monomers in the second solution is equal to the target composition ratio showing the ratio of the contents of the constitutional units α'1 to α'n in the polymer (P) to be obtained.

For example, when the polymer (P) is a ternary polymer obtained by copolymerizing monomers x, y and z and the target composition ratio (mol %, the same as follows) is x':y':z', the second composition ratio (mol %, the same as follows) x:y:z is equal to x':y':z'.

The second solution is dripped to feed it in the reactor.

(First Solution)

The ratio of the contents (first composition ratio) of the monomers in the first solution is determined in advance from the target composition ratio of the polymer (P) taking the reactivity of each monomer used in the polymerization into account.

To describe in more detail, when the ratio of the contents of the monomers existing in the reactor is the first composition ratio, the first composition ratio is designed so that the ratio of the contents of the constitutional units of a polymer molecule generated just after the above second solution is added dropwise to the reactor is equal to the target composition ratio. In this case, the ratio of the contents of the constitutional units of a polymer molecule generated just after the above second solution is added dropwise is equal to the ratio of the contents (target composition ratio) of the monomers in the second solution to be added dropwise, and therefore, the content ratio of the monomers left in the reactor just after the dropwise addition is always fixed (first composition ratio). Therefore, when the second solution is successively added dropwise to such a reactor, a stationary state under which a polymer molecule having the target composition ratio is successively produced is obtained.

There has been no information regarding a first composition enabling such a stationary state prior to the present invention. This is a finding first obtained by the inventors of the present invention. A method of designing the first composition will be described later.

The reactor may be charged with the first composition in advance. Also, the first solution may be gradually fed to the reactor by adding it dropwise or the like. Alternatively, these feed methods may be combined.

(Polymerization Initiator)

The polymerization initiator is added dropwise and fed to the reactor. The second solution may contain the polymerization initiator. For adding the first solution dropwise to the reactor, the first solution may contain the polymerization initiator. A solution containing the polymerization initiator may be added dropwise to the reactor separately from the first and second solutions. Alternatively, these solutions may be combined together.

The amount of the polymerization initiator to be used (the whole amount of the polymerization initiator to be fed) is designed on the basis of the type of polymerization initiator or according to the target value of the weight-average molecular weight of the polymer (P).

For example, when the polymer (P) in the present invention is a polymer for lithography, the amount of the polymerization initiator (the total amount thereof to be fed) based on 100 mol % of the sum (whole feed amount) of the monomers fed to the reactor is preferably in a range from 1 to 25 mol % and more preferably in a range from 1.5 to 20 mol %.

(Content of Monomers)

The total amount of monomers to be used in polymerization (whole amount of the monomers to be fed) is the sum of the total amount of the monomers contained in the first solution and the total amount of the monomers contained in the second solution. The whole amount of the monomers to be fed is designed on the basis of the amount of the polymer (P) to be obtained.

When the ratio of the total amount of the monomers contained in the first solution in the whole amount of the monomers is too small, the intended effect obtained by the use of the first solution is insufficiently obtained. When the proportion is too large on the other hand, the molecular weight of the polymer produced in the early stage of the polymerization process becomes too large. Therefore, the total amount of the monomers contained in the first solution based on the total amount of the monomer to be fed is preferably 3 to 40% by mass and more preferably 5 to 30% by mass.

(Polymerization Step)

In the polymerization step, it is necessary that the first solution exist in the reactor when the polymerization initiator is added dropwise to the reactor. Therefore, the feeding of the first solution to the reactor is started before the polymerization initiator is added dropwise to the reactor or simultaneously with the start of the dropwise addition of the polymerization initiator.

It is also necessary that the first solution exist in the reactor when the second solution is added dropwise to the reactor. Therefore, the feeding of the second solution to the reactor is started after the feeding of the first solution to the reactor is started or simultaneously with the start of the feeding of the first solution. The dropwise addition of the second solution is started simultaneously with the start of the dropwise addition of the polymerization initiator or after the start of the dropwise addition of the polymerization initiator. The dropwise addition of the polymerization initiator and the dropwise addition of the second solution are preferably started at the same time.

The second solution may be added dropwise either continuously or intermittently and the second solution may be added dropwise at a varied rate. The second solution may be preferably added dropwise continuously at a constant rate to stabilize the composition and molecular weight of the polymer to be produced.

When the first solution is fed by dropwise addition, it may be added dropwise either continuously or intermittently. Also, the first solution may be added dropwise at a varied rate. The first solution may be preferably added dropwise continuously at a constant rate to stabilize the composition and molecular weight of the polymer to be produced.

The whole amount of the first solution is preferably fed in the initial stage of the polymerization step. To describe in more detail, when the standard time is a time elapsed since the dropwise addition of the polymerization initiator is started until the dropwise addition of the second solution is completed, the feeding of the first solution is stopped before 20% of the above standard time is elapsed. When the standard time is, for example, 4 hours, the whole amount of the first solution is fed to the reactor before 48 minutes elapses after the start of the dropwise addition of the polymerization initiator.

The feeding of the first solution is completed before preferably 15% and more preferably 30% of the standard time elapses.

Also, the feeding of the whole amount of the first solution may be completed at 0% of the standard time. In other words, the reactor may be charged with the whole amount of the first solution before the start of the dropwise addition of the polymerization initiator.

The feed amount of the polymerization initiator in the initial stage of the polymerization step is increased. To describe in detail, when an average feed rate Vj is a value obtained by dividing the whole feed amount of the polymerization initiator by the standard time, a period from 0% to j % (j is 5 to 20) of the standard time is defined as the high-rate feeding period of the polymerization initiator. During the high-rate feeding period, the polymerization initiator is added dropwise at a rate higher than the average feed rate Vj.

The high-rate feeding period of the polymerization initiator begins at the start of the standard time, that is, 0% of the standard time. The high-rate feeding period of the polymerization initiator terminates when j % of the standard time elapses. The above j % is in a range from 5 to 20%, preferably 5.5 to 17.5% and more preferably 6 to 15%.

The amount of the polymerization initiator to be fed to the reactor in the high-rate feeding period is 30 to 90% by mass of the whole feed amount of the polymerization initiator. The weight-average molecular weight of the polymer generated in the early stage of the polymerization step varies corresponding to the amount of the polymerization initiator to be fed during the high-rate feeding period. Therefore, the optimum amount of the polymerization initiator to be fed during the high-rate feeding period differs depending on the types of monomers, feed rate of the monomers, type of polymerization initiator and polymerization condition. However, the optimum amount of the polymerization initiator is preferably set so that the weight-average molecular weight of the polymer generated particularly in the early stage of the polymerization step is close to the target value. The above feed amount is preferably 35 to 85% by mass and more preferably 40 to 80% by mass of the whole feed amount of the polymerization initiator.

It is necessary that the rate of dropwise addition of the polymerization initiator during the high-rate feeding period be kept higher than the above average feed rate. The rate of dropwise addition of the polymerization initiator may be changed during the course of the high-rate feeding period.

It is necessary that the rate of dropwise addition of the polymerization initiator after the end of the high-rate feeding period be lower than the above average feed rate. The rate of dropwise addition of the polymerization initiator may be changed during the course of the process after the end of the high-rate feeding period. The polymerization initiator may be added dropwise either continuously or intermittently.

The dropwise addition of the polymerization initiator is preferably completed after the feeding of the first solution is completed or simultaneously with completion of the feeding of the first solution.

Although the dropwise addition of the polymerization initiator and the dropwise addition of the second solution are preferably completed simultaneously, the finish times of both may be slightly different from each other to the extent that the effect of the present invention is not impaired.

Preferable examples of the embodiment of the polymerization step include the following (a) and (b).

(a) The reactor is charged with the first solution containing the monomers $\alpha_1$ to $\alpha_n$ in the first composition in advance. Then, the solution in the reactor is heated to a predetermined polymerization temperature, and then, a polymerization initiator solution containing a part of the polymerization initiator and the second solution containing the monomers $\alpha_1$ to $\alpha_n$ in the second composition and the rest of the polymerization initiator are respectively added in the above reactor. The dropwise addition of the polymerization initiator solution and the dropwise addition of the second solution are started simultaneously or the dropwise addition of the polymerization initiator solution is started first. The dropwise addition of the polymerization initiator solution and the dropwise addition of the second solution are preferably started simultaneously. The time elapsing since the start of the dropwise addition of the polymerization initiator solution until the start of the dropwise addition of the second solution is preferably 0 to 10 minutes.

The rates of dropwise addition are each preferably fixed. The dropwise addition of the polymerization initiator solution is completed before the dropwise addition of the second solution.

In this embodiment, when the dropwise addition of the polymerization initiator solution is started, the standard time starts, that is, the dropwise addition of the polymerization is started. In this embodiment, before the dropwise addition of the polymerization initiator is started, the whole amount of the first solution is fed to the reactor. Specifically, the feeding of the first solution is completed at 0% of the standard time. The high-rate feeding period is a period during which the polymerization initiator solution is added dropwise. The amount of the polymerization initiator to be fed to the reactor during the high-rate feeding period is the sum of the amount of the polymerization initiator contained in the polymerization initiator solution and amount of the polymerization initiator contained in the second solution added dropwise for the period during which the polymerization initiator solution is added dropwise. The dropwise addition of the polymerization initiator is completed when the dropwise addition of the second solution is completed.

(b) The reactor is charged only with a solvent. Then, the solvent is heated to a predetermined polymerization temperature, and then, the first solution containing the monomers $\alpha_1$ to $\alpha_n$ in the first composition ratio and a part of the polymerization initiator and the second solution containing the monomers $\alpha_1$ to $\alpha_n$ in the second composition ratio and the rest of the polymerization initiator and the rest of the polymerization initiator are respectively added in the above reactor. The dropwise additions of both solutions are started simultaneously or the dropwise addition of the first solution is first started. The time elapsing since the start of the dropwise addition of the first solution until the start of the dropwise addition of the second solution is preferably 0 to 10 minutes.

The rates of dropwise additions of the first solution and second solution are each preferably fixed. The dropwise addition of the first solution is completed before the dropwise addition of the second solution.

In this embodiment, the dropwise addition of the polymerization initiator is started simultaneously with the start of the dropwise addition of the first solution. The high-rate feeding period is a period during which the first solution is added dropwise. The amount of the polymerization initiator to be fed to the reactor during the high-rate feeding period is the sum of the amount of the polymerization initiator contained in the first solution and amount of the polymerization initiator contained in the second solution added dropwise for the period during which the first solution is added dropwise. The dropwise addition of the polymerization initiator is completed when the dropwise addition of the second solution is completed.

According to the method of the present invention, the first and second solutions in which the content ratio of the monomers is designed so that the aforementioned stationary state is obtained are used, ensuring that a polymer molecule having the same composition ratio as the target composition ratio is produced just after the start of a polymerization reaction.

Therefore, a variation in the percentage of the constitutional unit in the polymer (P) obtained after the polymerization step is reduced. This leads to an improvement in the solubility of the polymer in the solvent and in the sensitivity of a resist composition containing the polymer.

According to the method of the present invention, in addition, the first solution containing the monomers is fed before the early stage of the polymerization step and also, the early stage of the polymerization step is designed to be the high-rate feeding period of the polymerization initiator, ensuring that a variation in weight-average molecular weight as a function of reaction time is reduced. This improves the solubility of the polymer in a solvent and the sensitivity of a resist composition containing the polymer. This may be due to the fact that the generation of a polymer molecule having an excessively high weight-average molecular weight is limited.

Therefore, according to the present invention, the polymer (P) that has good solubility in a solvent and can constitute a highly sensitive resist composition can be obtained with high reproducibility.

It is to be noted that the polymer of the present invention may be applied to use in applications other than resist applications. In addition, according to the polymer of the present invention, a solubility-improving effect can be obtained. Furthermore, improvements in various performances can be expected.

<Method of Designing First Composition Ratio>

A method of designing the first composition ratio will be described.

When $\alpha'_1:\alpha'_2:\ldots:\alpha'_n$ is the content ratio (target composition ratio, unit:mol %) of the constitutional units in the polymer (P) to be obtained, $\alpha_1:\alpha_2:\ldots:\alpha_n$ represents the first composition (unit:mol %), and $F_1, F_2, \ldots$ and $F_n$, are factors calculated according to the following procedures (i) to (iii).

(i) First, a dropping solution containing 100 parts by mass of a monomer mixture having the same monomer composition as the target composition ratio, $\alpha'_1:\alpha'_2:\ldots:\alpha'_n$, a polymerization initiator and a solvent are added dropwise to a reactor only containing a solvent at a fixed dropping rate. Then, the composition ratio (unit:mol %), $M_1:M_2:\ldots:M_n$, of the monomers $\alpha_1$ to $\alpha_n$ left in the reactor is determined at each of times $t_1, t_2, t_3\ldots$, and $t_m$ passed from the start of the dropwise addition. In addition, a ratio (mol %) of $P_1:P_2:\ldots:P_n$ of the constitutional units $\alpha'_1$ to $\alpha'_n$ in each of polymers which are produced between the time $t_1$ to the time $t_2$, between the time $t_2$ to the time $t_3, \ldots$, and between the time $t_m$ to the time $t_{m+1}$ is calculated.

(ii) A time zone from $t_m$ to $t_{m+1}$ (m represents an integer of 1 or more) when the ratio $P_1:P_2:\ldots:P_n$ becomes nearest to the target composition ratio $\alpha'_1:\alpha'_2:\ldots:\alpha'_n$ is determined.

(iii) Factors $F_1, F_2, \ldots$, and $F_n$ are determined from the value of $P_1:P_2:\ldots:P_n$ between $t_m$ and $t_{m+1}$ and the value of $M_1:M_2:\ldots:M_n$ at the passage of time $t_m$ according to the equations $F_1=P_1/M_1$, $F_2=P_2/M_2, \ldots$, and $F_n=P_n/M_n$.

When, for example, the polymer (P) is a ternary polymer obtained by copolymerizing monomers x, y and z, and the target composition ratio is x':y':z', to explain in more detail, the first composition ratio (mol %, the same as follows) $x_0:y_0:z_0$ are defined as values obtained by the following equations $x_0=x'/Fx$, $y_0=y'/Fy$ and $z_0=z'/Fz$ by using the factors Fx, Fy and Fz calculated by the following method.

(Method of Calculating the Factors Fx, Fy and Fz)

The case where the polymer (P) is, for example, a ternary polymer will be described. However, the factors can be calculated in the same manner even in the case where the polymer (P) is a binary polymer or a quaternary or more multiple component polymer.

(1) First, dropping solution containing a monomer mixture having the same monomer composition ratio as the target composition ratio x':y':z', a solvent and a polymerization initiator is added dropwise at a constant dropping rate v in a reactor. The reactor is charged only with a solvent prior to the addition.

The composition ratio (unit:mol %), Mx:My:Mz, of the monomers x, y and z left in the reactor at each of times $t_1, t_2, t_3 \ldots$, and $t_m$ from the start of the dropwise addition is determined. In addition, a ratio (mol %) of Px:Py:Pz of the constitutional units in each of polymers produced between the time $t_1$ to the time $t_2$, between the time $t_2$ to the time $t_3, \ldots$, and between the time $t_m$ to the time $t_{m+1}$ is calculated.

(2) A time zone from $t_m$ to $t_{m+1}$ (m represents an integer of 1 or more) when the ratio Px:Py:Pz becomes nearest to the target composition ratio x':y':z' is determined.

(3) Factors Fx, Fy, and Fz are determined from the value of Px:Py:Pz between $t_m$ and $t_{m+1}$ and the value of Mx:My:Mz at the passage of time $t_m$ according to the equations Fx=Px/Mx, Fy=Py/My, Fz=Pz/Mz.

The factors Fx, Fy and Fz are respectively a value reflecting the relative reactivity of each monomer. Also, when the combination of the monomers or target composition ratio used in the polymerization is changed, the factors Fx, Fy and Fz are changed.

(4) Preferably, the proportion ($W_0$% by mass) of the total mass of the monomers existing in the reactor at the above passage of time tm is determined based on 100% by mass of the monomer mixture contained in the first dropping solution.

In the method of the present invention, the effect of producing a polymer molecule having the same composition as the target composition ratio is easily obtained just after the start of the polymerization reaction, when the proportion of the total amount of the monomers contained in the first solution based on the whole feed amount of the monomers is $W_0$% by mass.

<Resist Composition>

The resist composition of the present invention is prepared by dissolving the polymer for lithography of the present invention in a resist solvent. The resist solvent is, for example, the same one as the above polymerization solvent used in the production of the polymer.

When the resist composition of the present invention is a chemical amplification-type resist composition, it further contains a compound (hereinafter referred to as a photoacid generator) that generates an acid by irradiation with active rays or radial rays.

(Photoacid Generator)

As the photoacid generator, an appropriate one may be selected from known photoacid generators in chemical amplification type resist compositions. One type of photoacid generator may be used singly. Also, two or more photoacid generators may be used in combination.

Examples of the photoacid generator include onium salt compounds, sulfoneimide compounds, sulfone compounds, sulfonate compounds, quinonediazide compounds, and diazomethane compounds.

The content of the photoacid generator in the resist composition is preferably 0.1 to 20 parts by mass and more preferably 0.5 to 10 parts by mass based on 100 parts by mass of the polymer.

(Nitrogen-Containing Compound)

The chemical amplification type resist composition may contain a nitrogen-containing compound. When the chemical amplification type resist composition contains a nitrogen-containing compound, further improvements in the shape of a resist pattern and post exposure stability can be attained. Namely, the sectional shape of a resist pattern becomes closer to a rectangular shape. Also, in a mass-production line of a semiconductor, there is the case where a resist film is allowed to stand for several hours after the resist film is irradiated with light and then baked (PEB). However, in this embodiment, deterioration in the sectional shape of a resist pattern caused by such a condition that the resist pattern is allowed to stand (deterioration with time) is more restrained.

The nitrogen-containing compound is preferably an amine, more preferably a secondary lower aliphatic amine, and a tertiary lower aliphatic amine.

The content of the nitrogen-containing compound in the resist composition is preferably 0.01 to 2 parts by mass based on 100 parts by mass of the polymer.

(Organic Carboxylic Acid and Oxoacid of Phosphorous or its Derivatives)

The chemical amplification type resist composition may contain an organic carboxylic acid and oxoacid of phosphorous or its derivatives (hereinafter these compounds are collectively called acid compounds). When the chemical amplification type resist composition contains an acid compound, deterioration in sensitivity caused by the formulation of a nitrogen-containing compound can be restrained. Also, further improvements in the shape of a resist pattern and post exposure stability can be attained.

Examples of the organic carboxylic acid include malonic acid, citric acid, malic acid, succinic acid, benzoic acid and salicylic acid.

Examples of oxoacid of phosphorous or its derivatives include phosphoric acid or its derivatives, phosphonic acid or its derivatives and phosphinic acid or its derivatives.

The content of the acid compound in the resist composition is preferably 0.01 to 5 parts by mass.

(Additives)

The resist composition of the present invention may contain a surfactant and other additives such as a quencher, a sensitizer, a halation-preventive agent, a storage stabilizing agent, and an antifoaming agent if needed. All additives known in the above field may be used as the additives. Also, no particular limitation is imposed on the amount of these additives, and the amount of these additives may be optionally determined.

<Method for Producing Substrate with Pattern Formed Thereon>

An example of a method for producing a substrate with a pattern formed thereon according to the present invention will be described.

First, the resist composition of the present invention is applied by the spin coating method to the surface of a substrate such as a silicon wafer on which a desired fine pattern is to be formed. Then, the substrate coated with the resist composition is dried by a baking treatment (prebaked) to thereby form a resist film on the substrate.

Then, the resist film is exposed to light through a photomask to form a latent image. The exposure light is preferably light having a wavelength of 250 nm or less. The exposure light is preferably a KrF excimer laser, ArF excimer laser, F2 excimer laser and EUV light and more preferably an ArF excimer laser. Immersion exposure may be performed in which the resist film is irradiated with light in the condition that a liquid having a high refractive index is interposed between the resist film and the final lens of the exposure apparatus. The liquid having a high refractive index is, for example, pure water, perfluoro-2-butyltetrahydrofuran, and perfluorotrialkylamine.

After being exposed to light, the resist film is heat-treated (baked after being exposed, PEB). Then, an alkali developing solution is brought into contact with the resist film. Then, the exposed part is dissolved in the developing solution. Then, the developing solution is removed (developing). Examples of the alkali developing solution include known alkali developing solutions.

After the developing, the substrate is suitably rinse-treated. A resist pattern is formed on the substrate by this treatment.

The resist of the substrate on which the resist pattern is formed is reinforced by suitable heat treatment (post-baking). Then, the part on which no resist is formed is selectively etched.

After the etching, the resist is removed by a releasing agent to obtain the substrate on which a fine pattern is formed.

The polymer for lithography obtained by the production method of the present invention has excellent solubility in a solvent and enables the formation of a resist film having high sensitivity.

Therefore, when the resist composition is prepared, the polymer can be dissolved easily and well in a resist solvent. Also, the resist composition has excellent solubility in an alkali developing solution. This contributes to an improvement in sensitivity. Also, because insoluble substances in the resist composition are small, defects caused by the insoluble substances are scarcely generated.

According to the method for producing a substrate according to the present invention, therefore, a highly precise and fine resist pattern reduced in defects can be formed stably by using the resist composition of the present invention. Also, the resist composition of the present invention may be preferably used even in the case of forming a pattern by photolithography using exposure light having a wavelength of 250 nm or less or electron beam lithography, for example, lithography using an ArF excimer laser (193 nm) though it is required to use a resist composition having high sensitivity and high resolution in these kinds of lithography.

It is to be noted that when a resist composition is used in photolithography using exposure light having a wavelength of 250 nm or less, monomers suitably selected so that the polymer is transparent to exposure light having the above wavelength are preferably used.

<Division of a Copolymer by GPC>

Furthermore, in the case of the copolymer of the present invention, an eluate shows peaks relevant to the copolymer in an elution curve obtained by GPC. The eluate is divided into eight equal-volume fractions in order of fractionation. A difference between the monomer composition ratio of a copolymer contained in a first eluted fraction and the monomer composition ratio of all copolymers is −3 mol % to +3 mol % in any of the constitutional units derived from each monomer.

Figure 16:
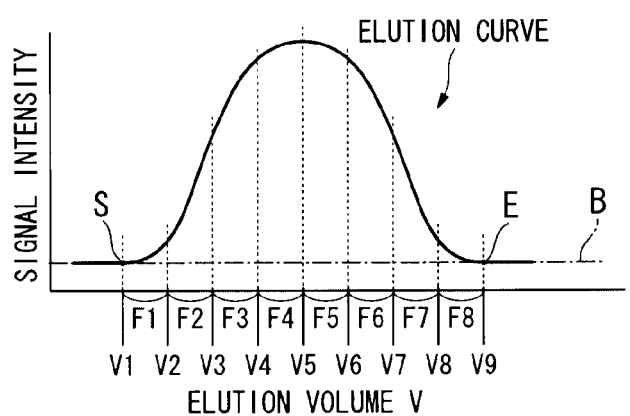
FIG. 16 is a view typically representing an example of an elution curve.

FIG. 16 schematically illustrates an example of an elution curve in GPC. The abscissa is an elution volume V (elution rate×elution time). The elution volume V is a cumulative volume of an eluate that flows out of the column and passes through the detector. The ordinate is a signal intensity detected when the eluate passes through the detector. Generally, when the distribution of molecular weight of the polymer is measured using GPC, the logarithm of the molecular weight of the polymer in the eluate passing through the detector monotonously decreases with increase in elution volume V. Specifically, a molecule having a larger molecule elutes earlier from the column. Also, the signal intensity is proportional to the existence amount of the polymer in the eluate passing through the detector.

The eluate exhibiting a peak originated from the copolymer in an elution curve obtained by GPC means the eluate passing through the detector between the peak start (represented by the sign S in FIG. 16) and peak end (represented by the sign E in FIG. 16) of the signal intensity in the elution curve.

In this case, a base line B is drawn on the elution curve. S is a point of intersection between the elution curve on the small elution volume side and the base line B. Also, E is a point of intersection between the elution curve on the large elution volume side and the base line B.

Also, the description "an eluate showing peaks is divided into eight fractions in order of fractionation such that each fraction has the same volume" means that the elution volume V between the peak start S and the peak end E is divided into eight equal parts in order of elution as shown by the dotted line in FIG. 16 and then, the eluate corresponding to each elution volume after being divided is separated as a fraction. Specifically, the elution volume V is divided into eight fractions to collect the eluate as illustrated in FIG. 16. These eight fractions are respectively called: fraction F1 obtained between the elution volumes V1 and V2; fraction F2 obtained between the elution volumes V2 and V3; fraction F3 obtained between the elution volumes V3 and V4; fraction F4 obtained between the elution volumes V4 and V5; fraction F5 obtained between the elution volumes V5 and V6; fraction F6 obtained between the elution volumes V6 and V7; fraction F7 obtained between the elution volumes V7 and V8; and fraction F8 obtained between the elution volumes V8 and V9.

In the present invention, the monomer composition ratio (hereinafter referred to as a divisional monomer composition ratio where necessary) of the copolymer contained in a first-eluted fraction among the obtained eight fractions is measured. The first-eluted fraction means a fraction when the elution volume V is smallest. This is, for example, the fraction F1 obtained between the elution volumes V1 and V2. A polymer having a higher molecular weight is contained in a smaller elution volume. There is the case where a first-eluted fraction is referred to as "high-molecular-weight fraction" where necessary in this specification.

The monomer composition ratio of the copolymer contained in the fraction can be determined by analyzing a GPC-fractionated solution (i.e., fraction) by $^1$H-NMR.

<Measurement of Monomer Composition Ratio of all Copolymers>

In the present invention, the monomer composition ratio (hereinafter also referred to as "average monomer composition ratio) of all copolymers before divided by GPC is also measured.

The average monomer composition ratio in the present invention may be analyzed using an infrared spectroscopy (IR) or nuclear magnetic resonance spectroscopy (NMR). A more precise value can be obtained by calculating the average monomer composition ratio from a ratio of a specific 1H signal intensities obtained by measuring the copolymer by $^1$H-NMR.

In the copolymer of the present invention, a difference between the divisional monomer composition ratio and the average copolymer composition ratio is −3 mol % to +3 mol % and preferably −2.6 mol % to +2.6 mol % in any of the constitutional units derived from each monomer.

When, for example, the copolymer is a ternary polymer constituted of constitutional units $\alpha'_1$, $\alpha'_2$ and $\alpha'_3$ and the composition ratios (also called content ratios, unit:mol %) of the constitutional units $\alpha'_1$, $\alpha'_2$ and $\alpha'_3$ in the average monomer composition ratio are X mol %, Y mol % and Z mol %, the content ratio (unit:mol %) of the constitutional unit $\alpha'_1$ in the divisional monomer composition ratio is in a range from (X−3) mol % to (X+3) mol % and preferably in a range from (X−2.6) mol % to (X+2.6) mol %.

Also, the content ratio (unit:mol %) of the constitutional unit $\alpha'_2$ in the divisional monomer composition ratio is in a range from (Y−3) mol % to (Y+3) mol % and preferably in a range from (Y−2.6) mol % to (Y+2.6) mol %.

Similarly, the content ratio (unit:mol %) of the constitutional unit $\alpha'_3$ in the divisional monomer composition ratio is in a range from (Z−3) mol % to (Z+3) mol % and preferably in a range from (Z−2.6) mol % to (Z+2.6) mol %.

If a difference between the divisional monomer composition ratio in the aforementioned high-molecular-weight fraction and the whole average monomer composition ratio is within ±3 mol %, the solubility of the copolymer in a solvent is efficiently improved as shown by the examples described later. Also, the sensitivity of a resist composition containing the above copolymer is improved.

The reason of obtaining such a solubility-improving effect is as follows.

Generally, the amount of each monomer to be used in the synthesis of a copolymer is determined on the basis of the target value of an intended monomer composition ratio. Also, a polymerization condition and the like are so designed that the average monomer composition ratio in a synthesized copolymer becomes close to the above target monomer composition ratio.

However, because the copolymerization reactivity rates of monomers to be copolymerized differ from each other in many cases, the monomers are not copolymerized at random. This causes a deviation from the target monomer composition ratio. Also, according to the finding of the inventors of the present invention, the monomer composition ratio of a produced copolymer also differs corresponding to a difference in reaction time (polymerization rate). Particularly, the monomer composition ratios of copolymers produced in the early and last stages tend to differ largely from the target value.

On the other hand, a solvent to be used in a composition for lithography is selected in accordance with the target value of the monomer composition ratio. It is therefore inferred that a deviation from the target monomer composition ratio impairs the solubility in a solvent.

In particular, a higher-molecular-weight compound may be generally less soluble in a solvent and therefore, a variation in monomer composition ratio in a high-molecular-weight region further impairs the solubility.

The molecular weight of the copolymer contained in the high-molecular-weight fraction in the present invention corresponds to a high-molecular-weight region in a range of the upper rank 12.5% (one-eighth) in the distribution of molecular weight of all copolymers. In the copolymer of the present invention, a deviation from the average monomer composition ratio is small in such a high-molecular-weight region. Therefore, good solubility of the copolymer may be obtained because of a small deviation from the target monomer composition ratio.

Also, a deviation in monomer composition ratio in all copolymers may be also reduced because of a small variation in monomer composition ratio in the high-molecular-weight region. Therefore, high sensitivity may be obtained by formulating the copolymer in a resist composition.

EXAMPLES

The present invention will be described in more detail by way of examples, which are however not intended to limit the present invention. In these examples, reference examples and comparative example, all designations of parts indicate parts by weight, unless otherwise noted.

Examples 1 to 3, Reference Examples 1 and 2, and Comparative Examples 1 and 2

The following measuring methods and evaluation methods were used.

(Measurement of Weight Average Molecular Weight)

The weight-average molecular weight (Mw) and distribution of molecular weight (Mw/Mn) of the polymer were determined in terms of polystyrene by gel permeation chromatography under the following conditions (GPC conditions).

(GPC Conditions)

Apparatus: trade name: Tosoh High-speed GPC apparatus HLC-8220GPC, manufactured by Tosoh Co., Ltd.;

Separation column: column prepared by connecting three columns (trade name: Shodex GPC K-805 L) in series;

Measuring temperature: 40° C.;

Eluent: tetrahydrofuran (THF);

Sample (in the case of a polymer): solution obtained by dissolving about 20 mg of a polymer in 5 mL of THF and by filtering the solution by a 0.5-µm membrane filter;

Sample (in the case of a polymerization reaction solution): solution obtained by dissolving about 30 mg of a polymerization reaction solution in 5 mL of THF and by filtering the solution by a 0.5-µm membrane filter;

Flow rate: 1 mL/min;

Charge amount: 0.1 mL; and

Detector: differential reflectometer

Calibration curve I: about 20 g of standard polystyrene was dissolved in 5 mL of THF. Then, the mixture solution was filtered through a 0.5-µm membrane filter to obtain a solution, which was then poured into a separation column in the above condition. Then, the relationship between elution time and molecular weight was determined. The following standard polyethylene (all products are represented by trade names) was used as the standard polyethylene.
F-80 (Mw=706,000);
F-20 (Mw=190,000);
F-4 (Mw=37,900);
F-1 (Mw=10,200);
A-2500 (Mw=2,630); and
A-500 (mixture of polystyrenes having Mw=682, 578, 474, 370, and 260).

(Quantitative Measurement of Monomer)

The amount of a monomer left in a polymerization reaction solution was determined by the following methods.

First, 0.5 g of the polymerization reaction solution in the reactor was sampled. Then, the sample solution was diluted to a total volume of 50 ml with acetonitrile using a measuring flask. This diluted solution was filtered through a 0.2-μm membrane filter. Then, the amount of an unreacted monomer in the above diluted solution was determined for every type of monomer by using a high-performance liquid chromatograph (trade name: HPLC-8020, manufactured by Tosoh Co., Ltd.).

The measurement was made under the following conditions. Specifically, one separation column (trade name: Inertsil ODS-2, manufactured by GL Sciences Inc.) was used as the separation column. A water/acetonitrile gradient type was used as the mobile phase. The flow rate was designed to be 0.8 mL/min. As the detector, an ultraviolet-visible absorptiometer (trade name: UV-8020, manufactured by Tosoh Co., Ltd.) was used. The detection wavelength was designed to be 220 nm. The measuring temperature was designed to be 40° C. The pouring amount was designed to be 4 μL. Also, Inertsil ODS-2 (trade name, particle diameter of silica gel: 5 μm and column inside diameter 4.6 mm×column length 450 mm) was used as the separation column. Also, the gradient condition of the mobile phase was designed to be as follows. The solution A is water. The solution B is acetonitrile. In order to quantitatively measure the amount of an unreacted monomer, three types of each monomer solution differing in concentration were used as standard solutions.

Measuring time 0 to 3 min: solution A/solution B=90 vol %/10 vol %.

Measuring time 3 to 24 min: solution A/solution B=90 vol %/10 vol % to 50 vol %/50 vol %.

Measuring time 24 to 36.5 min: solution A/solution B=50 vol %/50 vol % to 0 vol %/100 vol %.

Measuring time 36.5 to 44 min: solution A/solution B=0 vol %/100 vol %.

(Evaluation of Solubility of Polymer)

20 parts of the polymer and 80 parts of PGMEA were mixed. Then, the mixture was stirred at 25° C. while measuring the time required for dissolving the polymer completely. It was determined whether the polymer was completely dissolved or not.

(Evaluation of Sensitivity of Resist Composition)

The resist composition was applied to a 6-inch silicon wafer with rotation. Then, the wafer was prebaked (PAB) at 120° C. on a hot plate for 60 seconds to form a resist film 300 nm in thickness. Using an ArF excimer laser exposure apparatus (trade name: VUVES-4500, manufactured by Litho Tech Japan Corporation), 18 shots having an area of 10 mm×10 mm were exposed to light at varied doses. Then, the resist film was post-baked (PEB) at 110° C. for 60 seconds. After that, using a resist developing analyzer (trade name: RDA-806, manufactured by Litho Tech Japan Corporation), the resist film was developed at 23.5° C. by an aqueous 2.38% tetramethylammonium solution for 65 seconds. The resist film exposed at each dose was measured to detect a variation in resist film thickness with time during developing.

The relationship between the logarithm of the exposure dose (unit:mJ/cm$^2$) and the proportion (unit:%, hereinafter referred to as a residual film ratio) of a residual film thickness with respect to the initial film thickness when the resist film was developed for 30 seconds was plotted based on the obtained data of the variation in film thickness with time, to make a dose-residual film ratio curve. Based on this curve, the value of the exposure dose (Eth) required to reduce the residual film ratio to 0% was determined. Specifically, the exposure dose (mJ/cm$^2$) at the point where the dose-residual film ratio curve crosses a line of 0% residual film ratio was determined as Eth. This Eth value indicates the sensitivity of the resist composition. As this value becomes smaller, the sensitivity of the resist composition becomes higher.

Reference Example 1

Design of First Composition Ratio

In this example, a first composition ratio was determined in the case of polymerizing monomers m-1, m-2 and m-3 represented by the following formulae (m-1), (m-2) and (m-3) respectively to produce a polymer so designed that its target composition ratio was m-1:m-2:m-3=40:40:20 (mol %) and its target value of molecular weight was 10,000.

The polymerization initiator used in the present invention was dimethyl-2,2'-azobisisobutylate (trade name: V601, mentioned above). The polymerization temperature was set to 80° C.

[Chemical 1]

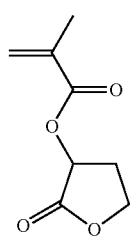

(m-1)

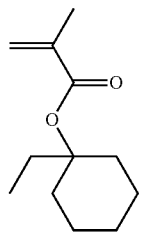

(m-2)

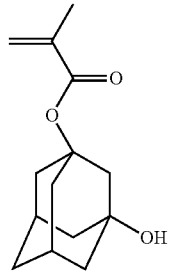

(m-3)

A flask equipped with a nitrogen introduction port, a stirrer, a condenser, a dropping funnel, and a temperature gauge was charged with 67.8 parts of ethyl lactate in a nitrogen atmosphere. The flask was bathed. Then, the bath temperature was raised to 80° C. while stirring the content in the flask.

Then, a dropping solution (total amount: 205.725 g) containing the following monomer mixture, solvent and polymerization initiator was prepared. Then, this solution was added dropwise over 4 hours to the flask at a fixed dropping rate by using the dropping funnel. Then, the flask was kept at 80° C. for 3 hours. After 7 hours passed since the dropwise addition of the dropping solution was started, the flask was cooled to ambient temperature to stop the reaction.

Monomer m-1: 28.56 parts (40 mol %);
Monomer m-2: 32.93 parts (40 mol %);
Monomer m-3: 19.82 parts (20 mol %);
Ethyl lactate: 122.0 parts; and
Dimethyl-2,2'-azobisisobutylate:2,415 parts (2.5 mol % of the total feed amount of the monomers).

When 0.5, 1, 2, 3, 4, 5, 6 and 7 hours passed after the drop-wise addition of the above dropping solution was started, 0.5 g of the polymerization reaction solution was sampled at each time. Then, the amounts of the monomers m-1 to m-3 were respectively measured quantitatively. From this, the mass of each monomer left in the reactor is determined. As a result, for example, the results obtained 2 hours and 3 hours after the dropwise addition is started are shown in Table 1.

TABLE 1

|  | After 2 hrs (parts by mass) | After 3 hrs (parts by mass) |
| --- | --- | --- |
| Monomer m-1 | 4.00 | 4.00 |
| Monomer m-2 | 7.24 | 7.75 |
| Monomer m-3 | 2.89 | 2.90 |

Then, the mass of each monomer was converted into the mol ratio (corresponding to Mx:My:Mz) of each monomer left in the reactor at each time of sampling by using the molecular weight of each monomer. As a result, for example, the results obtained 2 hours and 3 hours after the dropwise addition was started are shown in Table 2.

TABLE 2

|  | After 2 hrs (mol %) | After 3 hrs (mol %) |
| --- | --- | --- |
| Monomer m-1 (Mx) | 32.35 | 31.20 |
| Monomer m-2 (My) | 50.79 | 52.49 |
| Monomer m-3 (Mz) | 16.86 | 16.31 |

On the other hand, the total mass of each monomer fed until each sampling time was determined from the mass (total feed amount) of each monomer fed to the reactor at a fixed rate for 4 hours. Then, with regard to each monomer, the mass of the monomer left in the reactor at each sampling time was subtracted from this total mass to thereby calculate the mass of the monomer converted into a polymer at each sampling time among the monomer fed until the sampling time.

Then, with regard to each monomer, data of a difference between each sampling time was taken to find the mass of the monomer converted into a polymer between each sampling time. Then, this mass was converted into a molar fraction. The value of this molar fraction corresponds to the content ratio (hereinafter also referred to as a polymer composition ratio) Px:Py:Pz of the constitutional units in a polymer produced between each sampling time. The term "a polymer produced between each sampling time" means each polymer produced while the times (reaction times) elapsed from the start of dropwise addition were from $t_1$ to $t_2$, from $t_2$ to $t_3$, and from $t_m$ to $t_{m+1}$.

Figure 11:
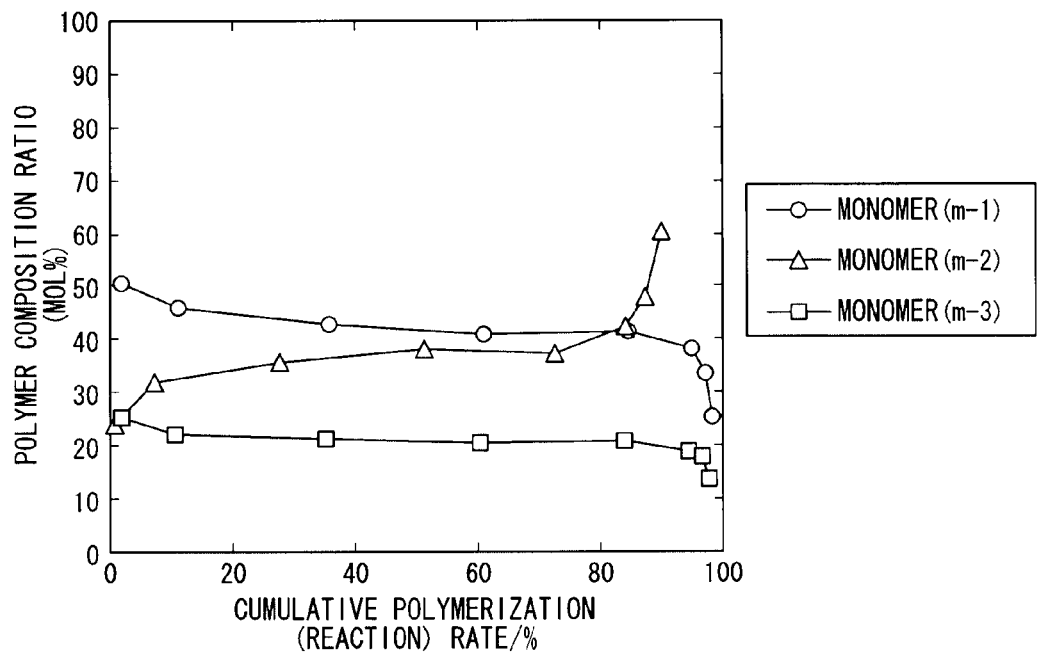
FIG. 11 is a graph representing the results of Reference Example 1.

The obtained results are shown in FIG. 1 and FIG. 11. The abscissa in FIG. 1 is the end side reaction time of each reaction time zone (between each sampling time). In FIG. 1, when, for example, the reaction time of the abscissa is 3 hours, the data corresponds to the data of a polymer produced between 2 hours and 3 hours after the start of the dropwise addition (same as follows). The reaction time of the abscissa in FIG. 1 is replaced with each cumulative polymerization (reaction) rate (%) to obtain a graph of FIG. 11.

Also, the weight-average molecular weight (Mw) and distribution of molecular weight (Mw/Mn) of the polymerization reaction solution obtained by sampling at each reaction time were determined by GPC measurement. The results are shown in Table 3 and FIG. 2.

Figure 2:
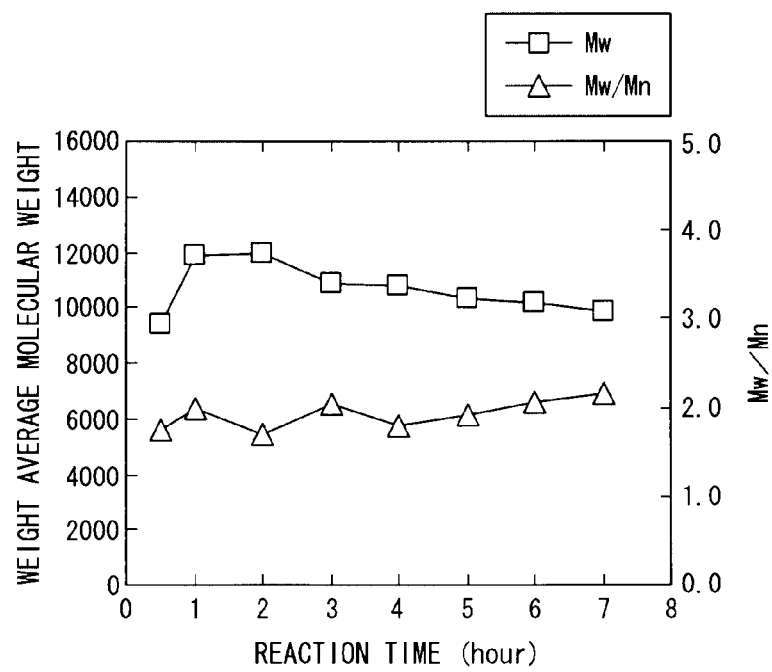
FIG. 2 is a graph representing the results of Reference Example 1.

The reaction time in Table 3 and FIG. 2 is the end side reaction time of each reaction time zone (between sampling times). When, for example, the reaction time of the abscissa is 3 hours, the data corresponds to the data of a polymer produced between 2 hours and 3 hours after the start of the dropwise addition (same as follows).

TABLE 3

| Reaction time (hrs) | Mw | Mw/Mn |
| --- | --- | --- |
| 0.5 | 9400 | 1.75 |
| 1 | 11900 | 1.98 |
| 2 | 12000 | 1.71 |
| 3 | 10900 | 2.04 |
| 4 | 10800 | 1.80 |
| 5 | 10300 | 1.91 |
| 6 | 10200 | 2.07 |
| 7 | 9900 | 2.16 |

As shown by the results in FIG. 1, the polymer composition ratio (Px:Py:Pz) in a polymer produced 2 hours to 3 hours after the dropwise addition was started was closest to the target composition ratio 40:40:20. The value of the polymer composition ratio was as follows: Px:Py:Pz=41.05:38.47:20.48.

Using this value and the value (Table 2) Mx:My:Mz obtained 2 hours after the dropwise addition was started, the factors Fx, Fy and Fz were calculated according to Fx=Px/Mx, Fy=Py/My and Fz=Pz/Mz, to find that Fx=1.27, Fy=0.76, and Fz=1.22.

The above factor and target composition ratio were used to find a first composition ratio $x_0:y_0:z_0$.
$x_0$=40/Fx=40/1.27=31.3 mol %
$y_0$=40/Fy=40/0.76=52.4 mol %
$z_0$=20/Fz=20/1.22=16.3 mol %

(Calculation of $W_0$)

The ratio ($W_0$) occupied by the total mass (14.13 parts from Table 1) of the monomer existing in the reactor 2 hours after the start of the dropwise addition in a monomer mixture (total of 81.31 parts) contained in the first dropping solution is 17.4% by mass.

Example 1

In this example, a polymer was produced using the first composition ratio determined in Reference Example 1 by the above method (a) according to the present invention. The type of monomer, type of polymerization initiator, polymerization temperature, target composition ratio of the polymer and target value of the weight-average molecular weight in use are the same as those in Reference Example 1.

A flask equipped with a nitrogen introduction port, a stirrer, a condenser, two dropping funnels and a temperature gauge was charged with the following first solution in a nitrogen atmosphere. The flask was bathed. Then, the bath temperature was raised to 80° C. while stirring the content in the flask.

Then, the following second solution was added dropwise to the flask by using the dropping funnel over 4 hours. Then, the flask was kept at 80° C. for 3 hours. Also, the following polymerization initiator solution was added dropwise to the flask by using another dropping funnel for 0.25 hours simultaneously with the start of the dropwise addition of the second solution. The flask was cooled to ambient temperature to terminate the reaction 7 hours after the dropwise addition of the second solution was started.

The ratio occupied by the monomer contained in the first solution based on the total feed amount of the monomers was set to 17.4% by mass according to $W_0$ in Reference Example 1.

In this example, the standard time is 4 hours. Also, the high-rate feeding period is the period (0.25 hours) during which the polymerization initiator solution was added dropwise. Specifically, the high-rate feeding period (0 to j %) is 0 to 6.25% (j=6.25%) of the standard time. The polymerization initiator to be fed to the reactor during high-rate feeding period is about 65% by mass of the total feed amount of the polymerization initiator.

(First Solution)
Monomer m-1: 3.87 parts (31.3 mol %);
Monomer m-2: 7.46 parts (52.4 mol %);
Monomer m-3: 2.80 parts (16.3 mol %); and
Ethyl lactate: 96.5 parts.
(Second Solution)
Monomer m-1: 23.34 parts (40 mol %);
Monomer m-2: 26.91 parts (40 mol %);
Monomer m-3: 16.20 parts (20 mol %);
Ethyl lactate: 98.9 parts; and
Dimethyl-2,2'-azobisisobutylate: 0.670 parts (0.7 mol % based on the total feed amount of the monomers).
(Polymerization Initiator Solution)
Ethyl lactate: 1.9 parts; and
Dimethyl-2,2'-azobisisobutylate: 1.243 parts (1.3 mol % based on the total feed amount of the monomers)

Figure 3:
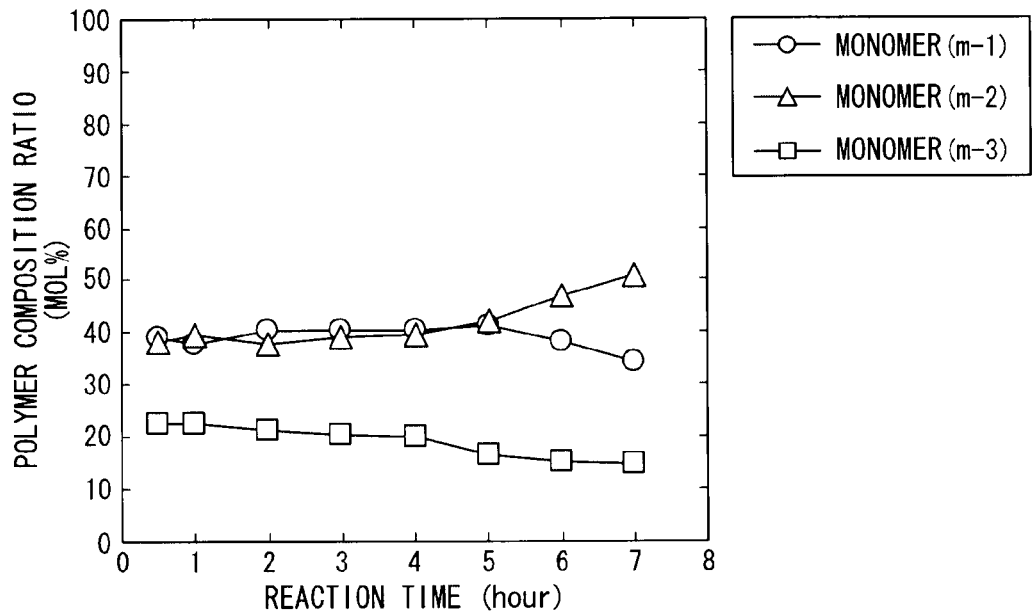
FIG. 3 is a graph representing the results of Example 1.

The content ratio (polymer composition ratio) of the constitutional units of a polymer produced in each reaction time was determined. The results are shown in FIG. 3. The reaction time of the abscissa in FIG. 1 is replaced with each cumulative polymerization (reaction) rate (%) to obtain a graph of FIG. 12.

Also, the weight-average molecular weight (Mw) and distribution of molecular weight (Mw/Mn) of the polymerization reaction solution obtained by sampling at each reaction time were determined in the same manner as in Reference Example 1. The results are shown in Table 4 and FIG. 4.

TABLE 4

| Reaction time (hrs) | Mw | Mw/Mn |
| --- | --- | --- |
| 0.5 | 9400 | 1.99 |
| 1 | 9000 | 1.89 |
| 2 | 9200 | 1.84 |
| 3 | 9600 | 1.81 |
| 4 | 9800 | 1.83 |
| 5 | 9700 | 1.83 |
| 6 | 9500 | 1.85 |
| 7 | 9500 | 1.83 |

The results shown in FIG. 1 and FIG. 3 are compared. In Reference Example 1 (FIG. 1), the polymer composition ratio of a polymer produced just after the dropwise addition was started largely deviates from the target composition ratio. Also, there is a large variation in polymer composition according to the reaction time.

In Example 1 (FIG. 3) in which the flask was charged with the first solution in advance, the polymer composition ratio was, on the other hand, almost equal to the target composition ratio at any time just after the dropwise addition was started. A variation in composition ratio corresponding to the reaction time was also improved. Particularly, the polymer composition ratio of a polymer obtained until the reaction time is 4 hours by continuous dropwise addition differs a little from the target composition ratio.

Figure 12:
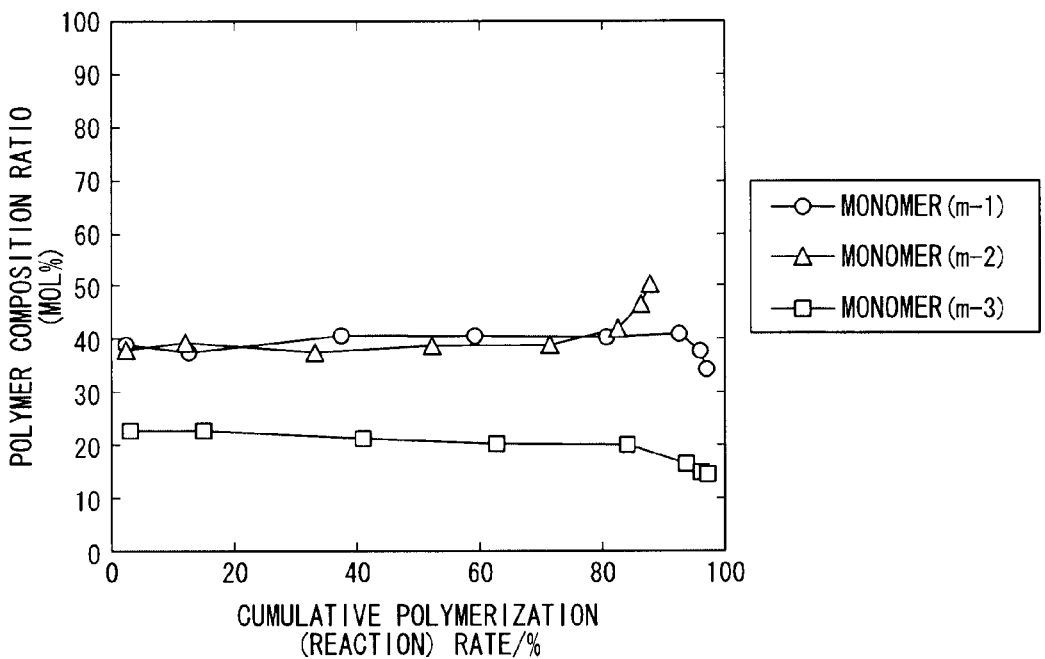
FIG. 12 is a graph representing the results of Example 1.

The results of FIG. 11 and FIG. 12 are compared with each other. In Reference Example 1 (FIG. 11), the polymer composition ratio of a polymer produced just after the start of the dropwise addition largely deviates from the target composition ratio from the viewpoint of cumulative polymerization (reaction) rate (%). Also, there is a large variation in polymer composition.

In Example 1 (FIG. 12) in which the flask is charged with the first solution in advance, the polymer composition ratio is almost equal to the target composition ratio at any time just after the start of the dropwise addition. Particularly, the polymer composition ratio of a polymer obtained until the cumulative polymerization (reaction) rate reaches 80% or more by continuous dropwise addition differs a little from the target composition ratio.

Figure 4:
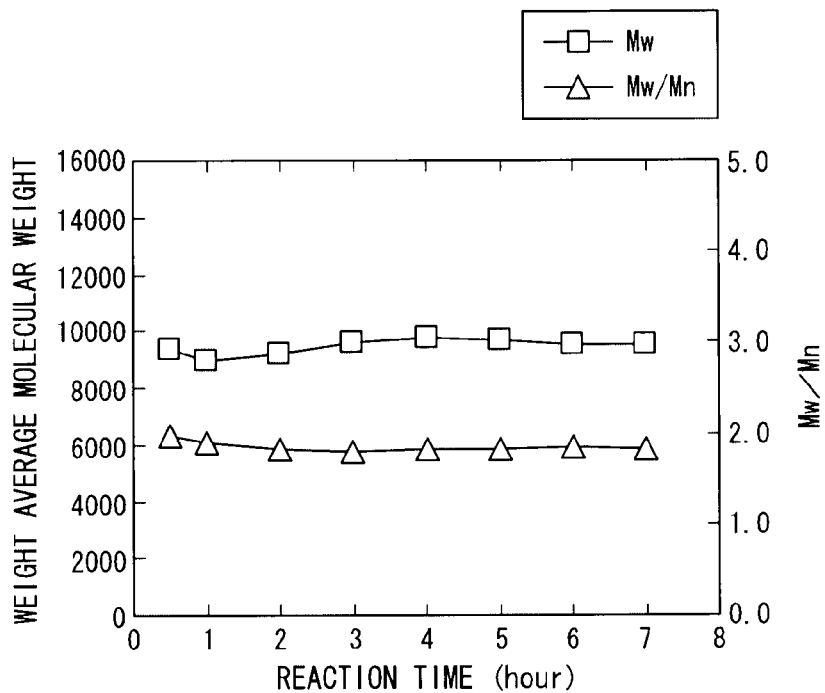
FIG. 4 is a graph representing the results of Example 1.

Also, the results of FIG. 2 and FIG. 4 are compared. In Reference 1 (FIG. 2), particularly, the weight-average molecular weight obtained 3 hours after the start of the dropwise addition largely differs from that of a polymer obtained after that time. Also, there is a large variation corresponding to the reaction time.

In Example 1 (FIG. 4), on the other hand, there are small variations in weight-average molecular weight and distribution of molecular weight corresponding to the reaction time just after the start of the dropwise addition until the end of the reaction.

(Refining of Polymer)

After the reaction was continued for 7 hours, the flask was cooled to ambient temperature to terminate the reaction. Then, the polymerization reaction solution in the flask was added dropwise to a mixture solvent of methanol and water (methanol/water=80/20 ratio by volume) having a volume ten times that of the reaction solution while stirring to obtain a white precipitate (polymer P1). The precipitate was separated by filtration. Then, the separated precipitate was again poured into a mixture solvent of methanol and water (methanol/water=90/10 ratio by volume) having the same amount as above. Then, the mixture was washed while stirring. Then, the washed precipitate was separated by filtration to obtain 160 g of a wet polymer powder. Subsequently, 10 g of the wet polymer powder was dried at 40° C. under reduced pressure for about 40 hours. Mw and Mw/Mn of the obtained polymer P1 were determined. Also, the solubility of the polymer P1 was evaluated. The results are shown in Table 10.

(Production of Resist Composition)

The rest of the above wet polymer powder was poured into 880 g of PGMEA. Then, the above wet polymer powder was completely dissolved to obtain a polymer solution. This polymer solution was passed through a nylon filter (trade name: P-NYLON N66FILTER 0.04 M, manufactured by Nihon Pall Ltd.) having a pore size of 0.04 μm to filter the polymer solution.

The obtained polymer solution was heated under reduced pressure to distill methanol and water. Further, PGMEA was distilled from the polymer solution. A polymer P1 solution was thus obtained. The concentration of the polymer in the polymer P1 solution was 25% by mass. In this case, the maximum ultimate vacuum was 0.7 kPa. The maximum solution temperature was 65° C. Also, the time required for distillation was 8 hours.

400 parts of the obtained polymer P1 solution, 2 parts of triphenylsulfonium triflate provided as a photoacid generator and PGMEA provided as a solvent were mixed such that the concentration of the polymer was 12.5% by mass to obtain a homogeneous solution. This solution was then subjected to filtration using a membrane filter having a pore size of 0.1 μm to obtain a resist composition. The sensitivity of the resist composition was evaluated by the above method. The results are shown in Table 10.

Example 2

In this example, a polymer was produced using the first composition ratio determined in Reference Example 1 by the above method (b) according to the present invention. The type of monomer, type of polymerization initiator, polymerization temperature, target composition ratio of the polymer and target value of the weight-average molecular weight in use are the same as those in Reference Example 1.

A flask equipped with a nitrogen introduction port, a stirrer, a condenser, two dropping funnels and a temperature gauge was charged with 86.5 parts of ethyl acetate in a nitrogen atmosphere. The flask was bathed. Then, the bath temperature was raised to 80° C. while stirring the content in the flask.

Then, the following second solution was added dropwise to the flask by using the dropping funnel over 4 hours. Then, the flask was kept at 80° C. for 3 hours. Also, the following first solution was added dropwise to the flask over 0.25 hours by using another dropping funnel simultaneously with the start of the dropwise addition of the second solution. The flask was cooled to ambient temperature to terminate the reaction 7 hours after the dropwise addition of the second solution was started.

The ratio occupied by the monomer contained in the first solution based on the total feed amount of the monomers was set to 17.4% by mass according to $W_0$ in Reference Example 1.

In this example, the standard time is 4 hours. Also, the high-rate feeding period is the period (0.25 hours) during which the first solution was added dropwise. Specifically, the high-rate feeding period (0 to j %) is 0 to 6.25% (j=6.25%) of the standard time. The polymerization initiator to be fed to the reactor during high-rate feeding period is about 65% by mass of the total feed amount of the polymerization initiator.
(First Solution)
Monomer m-1: 3.87 parts (31.3 mol %);
Monomer m-2: 7.46 parts (52.4 mol %);
Monomer m-3: 2.80 parts (16.3 mol %);
Ethyl lactate: 11.9 parts; and
Dimethyl-2,2'-azobisisobutylate: 1.243 parts (1.3 mol % based on the total feed amount of the monomers).
(Second Solution)
Monomer m-1: 23.34 parts (40 mol %);
Monomer m-2: 26.91 parts (40 mol %);
Monomer m-3: 16.20 parts (20 mol %);
Ethyl lactate: 98.9 parts; and
Dimethyl-2,2'-azobisisobutylate: 0.670 parts (0.7 mol % based on the total feed amount of the monomers).

Figure 5:
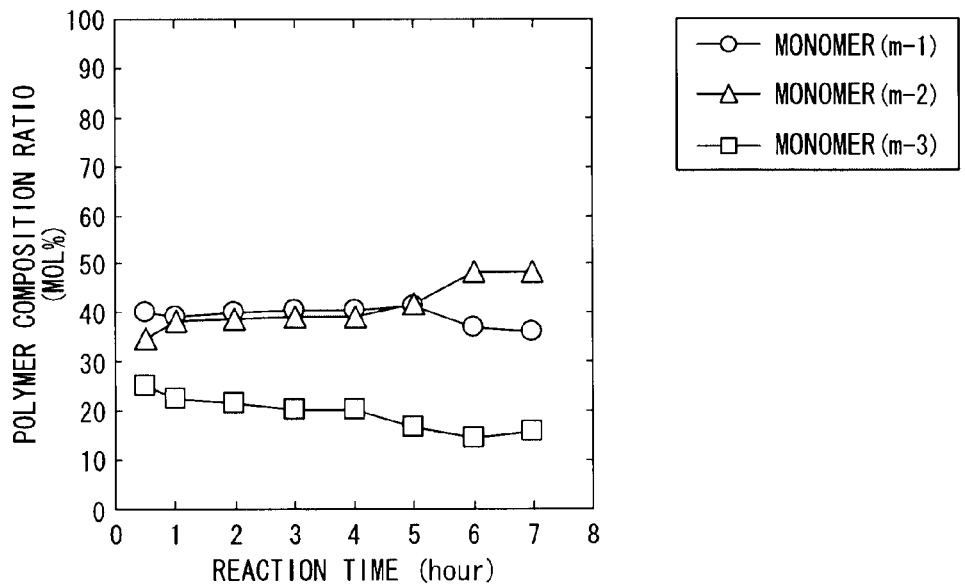
FIG. 5 is a graph representing the results of Example 2.
Figure 13:
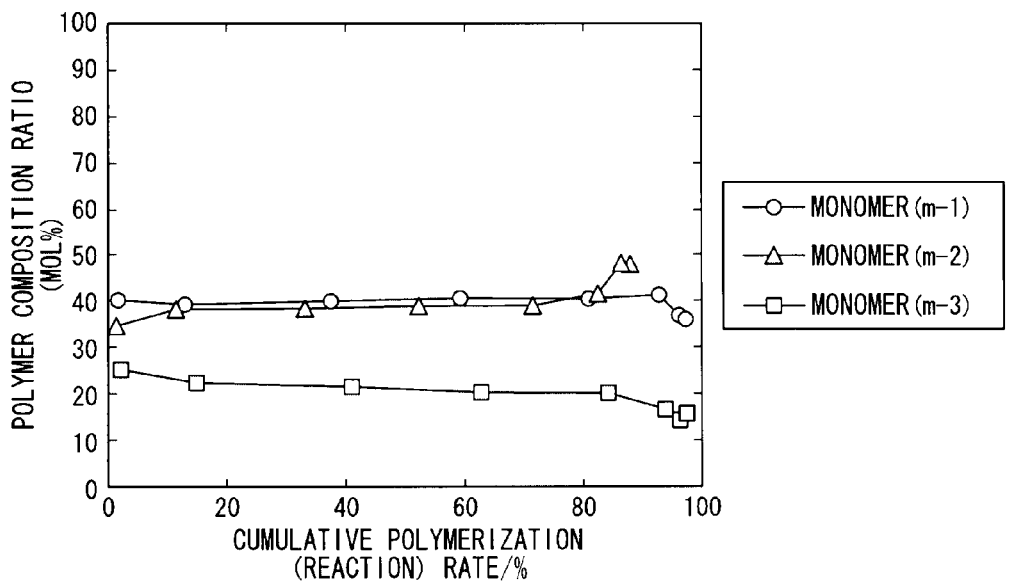
FIG. 13 is a graph representing the results of Example 2.

The content ratio (polymer composition ratio) of the constitutional units of the polymer produced in each reaction time was determined by the same procedures as in Reference Example 1. The results are shown in FIG. 5 and FIG. 13. The reaction time of the abscissa in FIG. 5 is replaced with each cumulative polymerization (reaction) rate (%) to obtain a graph of FIG. 13.

Also, the weight-average molecular weight (Mw) and distribution of molecular weight (Mw/Mn) of the polymerization reaction solution obtained by sampling at each reaction time were determined in the same manner as in Reference Example 1. The results are shown in Table 5 and FIG. 6.

TABLE 5

| Reaction time (hrs) | Mw | Mw/Mn |
|---|---|---|
| 0.5 | 8600 | 1.82 |
| 1 | 8900 | 1.87 |
| 2 | 9200 | 1.84 |
| 3 | 9600 | 1.81 |
| 4 | 9800 | 1.83 |
| 5 | 9700 | 1.83 |
| 6 | 9500 | 1.85 |
| 7 | 9500 | 1.83 |

As shown by the results of FIG. 5, the polymer composition ratio became almost equal to the target composition ratio at any time just after the dropwise addition was started. A variation in polymer composition ratio corresponding to the reaction time was also improved. This is the same as the result of Example 1. Particularly, the polymer composition ratio of a polymer obtained until the reaction time is 4 hours by continuous dropwise addition differs a little from the target composition ratio. Also, as shown by the results of FIG. 13, the polymer composition ratio is almost equal to the target composition ratio at any time just after the start of the dropwise addition. Particularly, the polymer composition ratio of a polymer obtained until the cumulative polymerization (reaction) rate reaches 80% or more by continuous dropwise addition differs a little from the target composition ratio.

Figure 6:
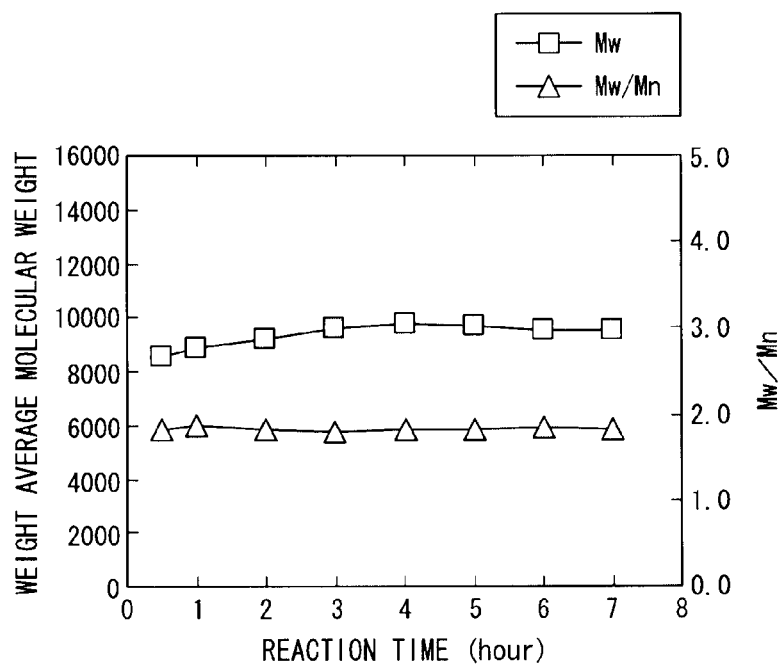
FIG. 6 is a graph representing the results of Example 2.

Also, as shown by the results of FIG. 6, there are small variations in weight-average molecular weight and distribution of molecular weight corresponding to the reaction time just after the start of the dropwise addition until the end of the reaction.
(Refining of Polymer)

A polymer P2 was obtained from the polymerization reaction in the flask just after the reaction was continued for 7 hours. Mw and Mw/Mn of the polymer P2 and the results of evaluation of solubility are shown in Table 10.
(Production of Resist Composition)

A resist composition containing the polymer P2 was prepared by the same procedures as in Example 1. Then, the sensitivity of the resist composition was evaluated. The results are shown in Table 10.

Reference Example 2

Design of First Composition Ratio

In this example, a first composition was determined in the case of polymerizing monomers m-4, m-5 and m-6 represented by the following formulae (m-4), (m-5) and (m-6) respectively to produce a polymer so designed that its target composition ratio was m-4:m-5:m-6=40:40:20 (mol %) and its target value of molecular weight was 10,000.

The polymerization initiator used in the present invention was dimethyl-2,2'-azobisisobutylate which was the same that was used in Reference Example 1. The polymerization temperature was set to 80° C.

[Chemical 2]

(m-4)
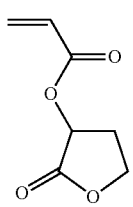

(m-5)
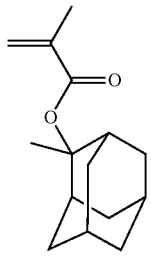

(m-6)
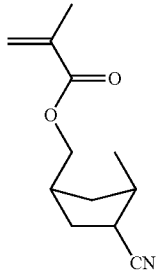

A flask equipped with a nitrogen introduction port, a stirrer, a condenser, a dropping funnel and a temperature gauge was charged with 70.6 parts of propylene glycol monomethyl acetate (PGMEA) in a nitrogen atmosphere. The flask was bathed. Then, the bath temperature was raised to 80° C. while stirring the content in the flask. Then, a dropping solution (total amount: 220.612 g) containing the following monomer mixture, solvent and polymerization initiator was prepared. Then, this solution was added dropwise to the flask at a fixed dropping rate by using the dropping funnel over 4 hours. Then, the flask was kept at 80° C. for 3 hours. After 7 hours passed since the dropwise addition of the dropping solution was started, the flask was cooled to ambient temperature to stop the reaction.

Monomer m-4: 26.83 parts (40 mol %);

Monomer m-5: 40.25 parts (40 mol %);

Monomer m-6: 17.63 parts (20 mol %);

PGMEA: 127.1 parts; and

Dimethyl-2,2'-azobisisobutylate: 8.802 parts (8.9 mol % of the total feed amount of the monomers).

First, 0.5 g of the polymerization reaction solution was sampled at each time when 0.5, 1, 2, 3, 4, 5, 6 and 7 hours passed after the drop-wise addition of the above dropping solution was started. Then, the amounts of the monomers m-4 to m-6 were respectively measured quantitatively. Thus, the mass of each monomer left in the reactor is determined. As a result, for example, the results obtained 1 hour and 2 hours after the dropwise addition is started are shown in Table 1.

TABLE 6

| | After 1 hr (parts by mass) | After 2 hrs (parts by mass) |
|---|---|---|
| Monomer m-4 | 2.60 | 2.62 |
| Monomer m-5 | 2.84 | 2.89 |
| Monomer m-6 | 0.96 | 0.98 |

Then, the mass of each monomer was converted into the mol ratio (corresponding to Mx:My:Mz) of each monomer left in the reactor at each time of sampling by using the molecular weight of each monomer.

As a result, for example, the results obtained 1 hour and 2 hours after the dropwise addition is started are shown in Table 7.

TABLE 7

| | After 1 hr (mol %) | After 2 hrs (mol %) |
|---|---|---|
| Monomer m-4 (Mx) | 49.80 | 49.46 |
| Monomer m-5 (My) | 36.17 | 36.39 |
| Monomer m-6 (Mz) | 14.03 | 14.15 |

Figure 7:
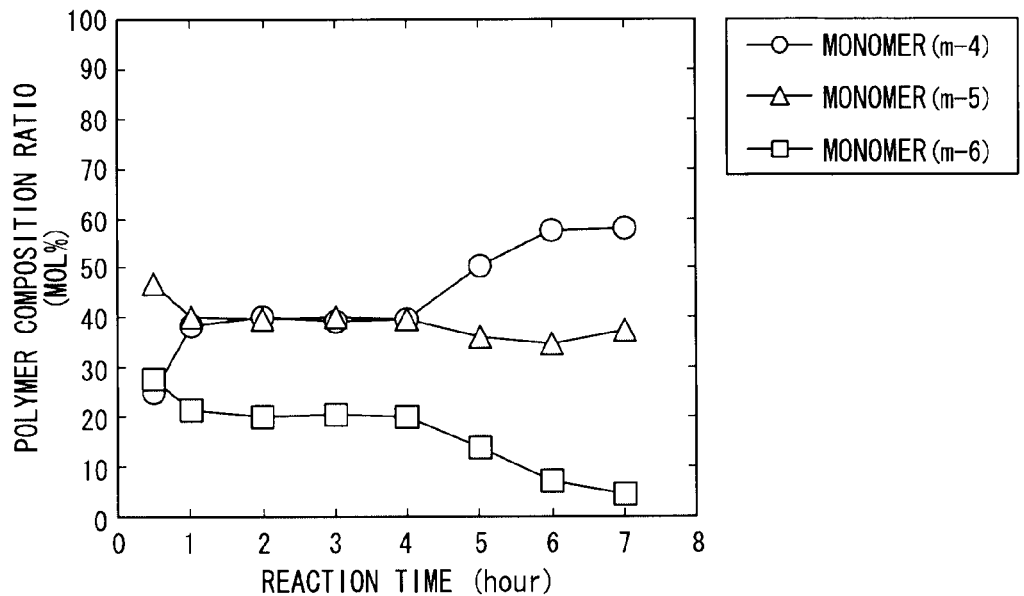
FIG. 7 is a graph representing the results of Reference Example 2.

On the other hand, the content ratio (polymer composition ratio, Px:Py:Pz) of the constitutional units in a polymer produced in each reaction time was determined by the same procedures as in Reference Example 1. The results are shown in FIG. 7. The reaction time of the abscissa in FIG. 7 is replaced with each cumulative polymerization (reaction) rate (%) to obtain a graph of FIG. 14.

Also, the weight-average molecular weight (Mw) and distribution of molecular weight (Mw/Mn) of the polymerization reaction solution obtained by sampling at each reaction time were determined. The results are shown in Table 8 and FIG. 8.

TABLE 8

| Reaction time (hrs) | Mw | Mw/Mn |
|---|---|---|
| 0.5 | 12800 | 2.17 |
| 1 | 12200 | 2.39 |
| 2 | 10700 | 2.29 |
| 3 | 9800 | 2.30 |
| 4 | 9400 | 2.23 |
| 5 | 9300 | 2.36 |
| 6 | 9300 | 2.43 |
| 7 | 9200 | 2.44 |

As shown by the results in FIG. 7, the polymer composition ratio (Px:Py:Pz) in a polymer produced 1 hour to 2 hours after the dropwise addition was started was closest to the target composition ratio 40:40:20. The value of the polymer composition ratio was as follows: Px:Py:Pz=40.07:39.95:19.99.

Using this value and the value (Table 7) Mx:My:Mz obtained 2 hours after the dropwise addition was started, the factors Fx, Fy and Fz were calculated according to Fx=Px/Mx, Fy=Py/My and Fz=Pz/Mz, to find that Fx=0.80, Fy=1.10, and Fz=1.42.

The above factor and target composition ratio were used to find a first composition ratio $x_0:y_0:z_0$.

$x_0$=40/Fx=40/0.80=49.8 mol %

$y_0$=40/Fy=40/1.10=36.2 mol % z0=20/Fz=20/1.42=14.0 mol %

(Calculation of $W_0$)

The ratio ($W_0$) occupied by the total mass (6.40 parts from Table 6) of the monomer existing in the reactor 1 hour after the start of the dropwise addition in a monomer mixture (total of 84.71 parts) contained in the first dropping solution is 7.6% by mass.

Example 3

In this example, a polymer was produced using the first composition ratio determined in Reference Example 2 by the above method (a) according to the present invention. The type of monomer, type of polymerization initiator, polymerization temperature, target composition ratio of the polymer and target value of the weight-average molecular weight in use are the same as those in Reference Example 2.

A flask equipped with a nitrogen introduction port, a stirrer, a condenser, two dropping funnels and a temperature gauge was charged with the following first solution in a nitrogen atmosphere. The flask was bathed. Then, the bath temperature was raised to 80° C. while stirring the content in the flask.

Then, the following second solution was added dropwise to the flask by using the dropping funnel over 4 hours. Then, the flask was kept at 80° C. for 3 hours. Also, the following polymerization initiator solution was added dropwise to the flask by using another dropping funnel for 0.25 hours simultaneously with the start of the dropwise addition of the second solution. The flask was cooled to ambient temperature to terminate the reaction 7 hours after the dropwise addition of the second solution was started.

The ratio occupied by the monomer contained in the first solution based on the total feed amount of the monomer was set to 7.6% by mass according to $W_0$ in Reference Example 2.

In this example, the standard time is 4 hours. Also, the high-rate feeding period is the period (0.25 hours) during which the polymerization initiator solution was added dropwise. Specifically, the high-rate feeding period (0 to j %) is 0 to 6.25% (j=6.25%) of the standard time. The polymerization initiator to be fed to the reactor during high-rate feeding period is about 55% by mass of the total feed amount of the polymerization initiator.
(First Solution)
Monomer m-4: 2.60 parts (49.8 mol %);
Monomer m-5: 2.84 parts (36.2 mol %);
Monomer m-6: 0.96 parts (14.0 mol %); and
PGMEA: 80.2 parts.
(Second Solution)
Monomer m-4: 24.80 parts (40 mol %);
Monomer m-5: 37.21 parts (40 mol %);
Monomer m-6: 16.30 parts (20 mol %);
PGMEA: 110.0 parts; and
Dimethyl-2,2'-azobisisobutylate: 3.456 parts (3.49 mol % based on the total feed amount of the monomers).
(Polymerization Initiator Solution)
PGMEA: 7.5 parts; and
Dimethyl-2,2'-azobisisobutylate: 4.224 parts (4.26 mol % based on the total feed amount of the monomers)

Figure 9:
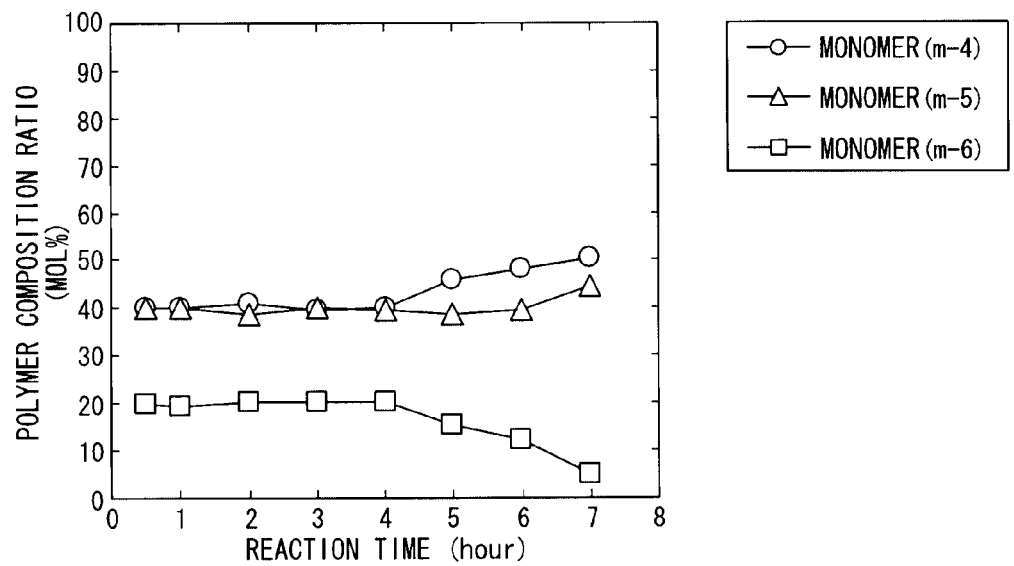
FIG. 9 is a graph representing the results of Example 3.

The content ratio (polymer composition ratio) of the constitutional units of a polymer produced in each reaction time was determined. The results are shown in FIG. 9. The reaction time of the abscissa in FIG. 9 is replaced with each cumulative polymerization (reaction) rate (%) to obtain a graph of FIG. 15.

Also, the weight-average molecular weight (Mw) and distribution of molecular weight (Mw/Mn) of the polymerization reaction solution obtained by sampling at each reaction time were determined in the same manner as in Reference Example 2. The results are shown in Table 9 and FIG. 10.

TABLE 9

| Reaction time (hrs) | Mw | Mw/Mn |
|---|---|---|
| 0.5 | 9600 | 2.31 |
| 1 | 9100 | 2.19 |
| 2 | 8800 | 2.21 |
| 3 | 8900 | 2.18 |
| 4 | 9100 | 2.18 |
| 5 | 9000 | 2.27 |
| 6 | 9000 | 2.30 |
| 7 | 9000 | 2.32 |

The results shown in FIG. 7 and FIG. 9 are compared. In Reference Example 2 (FIG. 7), the polymer composition ratio of a polymer produced just after the dropwise addition was started largely deviates from the target composition ratio. Also, there is a large variation in polymer composition ratio according to the reaction time.

In Example 3 (FIG. 9) in which the flask was charged with the first solution in advance, the polymer composition ratio was, on the other hand, almost equal to the target composition ratio at any time just after the dropwise addition was started. A variation in composition ratio corresponding to the reaction time was also improved. Particularly, the polymer composition ratio of a polymer obtained until the reaction time is 4 hours by continuous dropwise addition differs a little from the target composition of ratio.

Figure 14:
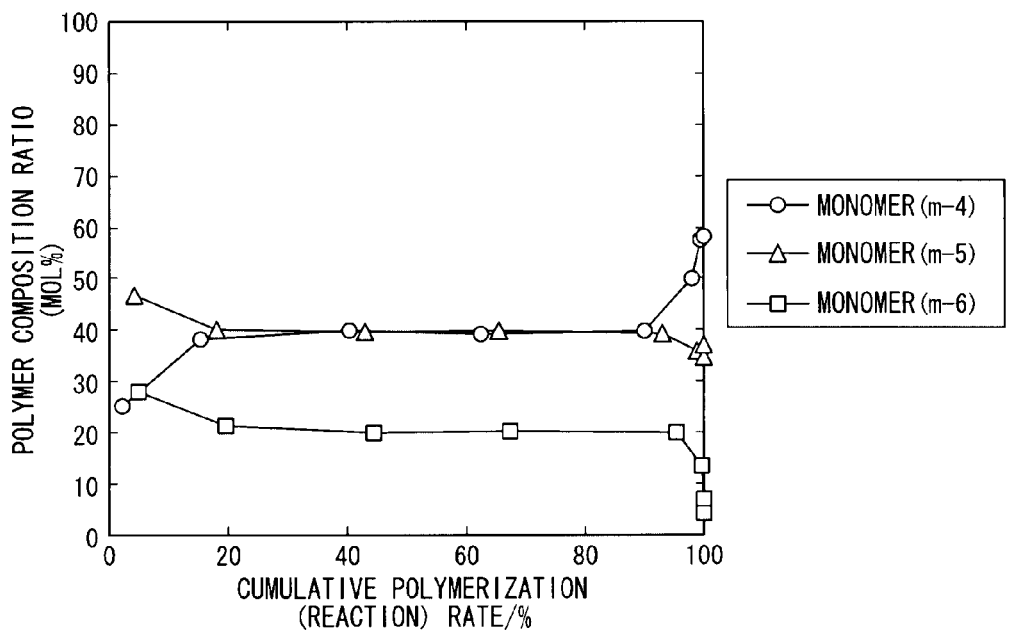
FIG. 14 is a graph representing the results of Reference Example 2.
Figure 15:
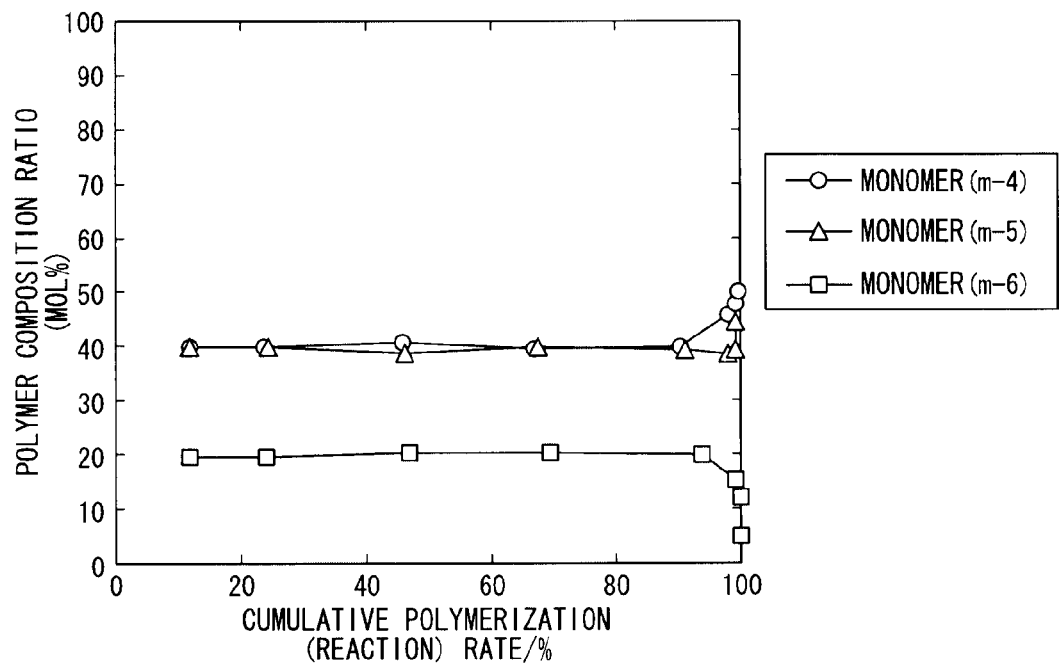
FIG. 15 is a graph representing the results of Reference Example 3.

The results of FIG. 14 and FIG. 15 are compared with each other. In Reference Example 2 (FIG. 14), the polymer composition ratio of a polymer produced just after the start of the dropwise addition largely deviates from the target composition ratio from the viewpoint of cumulative polymerization (reaction) rate (%). Also, there is a large variation in polymer composition ratio.

In Example 3 (FIG. 15) in which the flask is charged with the first solution in advance, the polymer composition ratio is almost equal to the target composition ratio at any time just after the start of the dropwise addition. Particularly, the polymer composition ratio of a polymer obtained until the cumulative polymerization (reaction) rate reaches 80% or more by continuous dropwise addition differs a little from the target composition ratio.

Figure 8:
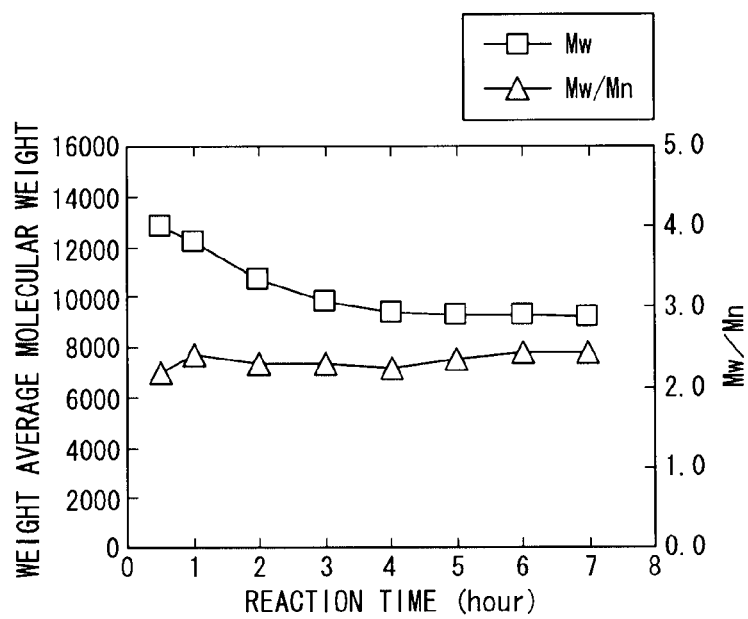
FIG. 8 is a graph representing the results of Reference Example 2.
Figure 10:
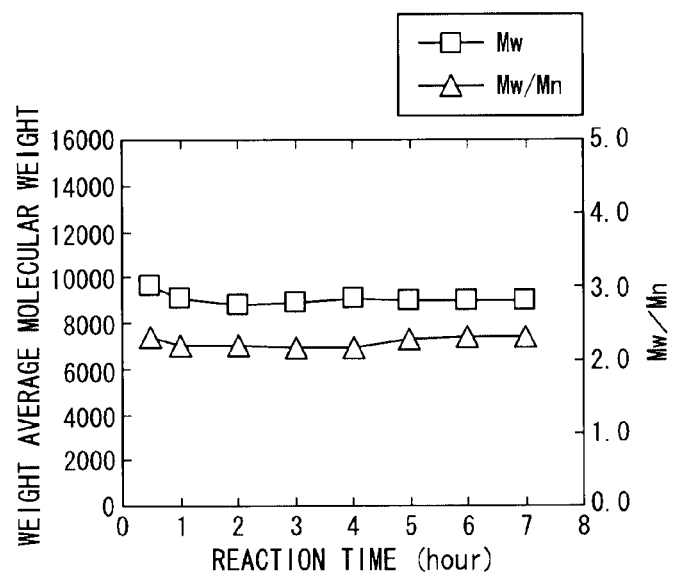
FIG. 10 is a graph representing the results of Example 3.

Also, the results of FIG. 8 and FIG. 10 are compared. In Reference 2 (FIG. 8), particularly, the weight-average molecular weight obtained 3 hours after the start of the dropwise addition largely differs from that of a polymer obtained after that time. Also, there is a large variation corresponding to the reaction time.

In Example 3 (FIG. 10), on the other hand, there are small variations in weight-average molecular weight and distribution of molecular weight corresponding to the reaction time just after the start of the dropwise addition until the end of the reaction.

(Refining of a Polymer)

The mixture solvent of methanol and water (methanol/water=80/20 volume ratio) and (methanol/water=90/10 volume ratio) were altered to a mixture solvent of methanol and water (methanol/water=90/10 volume ratio) and (methanol/water=95/5 volume ratio) respectively. A polymer P3 was obtained from the polymerization reaction solution in the flask after the reaction was continued for 7 hours by the same procedures as in Example 1 except for the above alteration. Mw and Mw/Mn, and also the solubility of the polymer P3 were evaluated. The results are shown in Table 10.

(Production of a Resist Composition)

A resist composition containing the polymer P3 was prepared by the same procedures as in Example 1. Then, the sensitivity of the resist composition was evaluated. The results are shown in Table 10.

Comparative Example 1

In Reference Example 1, the flask was cooled to ambient temperature to stop the reaction after the reaction was continued for 7 hours. A comparative polymer 1 was obtained using the obtained polymerization reaction solution in the flask by the same procedures as in the polymer refining step of Example 1. With regard to the comparative polymer 1, its Mw and Mw/Mn were determined and also, its solubility was evaluated.

Also, a resist composition was prepared using the comparative polymer 1 by the same procedures as in Example 1. Then, the sensitivity of the resist composition was evaluated. The results are shown in Table 10.

Comparative Example 2

In Reference Example 2, the flask was cooled to ambient temperature to stop the reaction after the reaction was continued for 7 hours. A comparative polymer 2 was obtained using the obtained polymerization reaction solution in the flask by the same procedures as in the polymer refining step of Example 3. With regard to the comparative polymer 2, its Mw and Mw/Mn were determined and also, its solubility was evaluated.

Also, a resist composition was prepared using the comparative polymer 2 by the same procedures as in Example 3. Then, the sensitivity of the resist composition was evaluated. The results are shown in Table 10.

TABLE 10

|  | Mw | Mw/Mn | Evaluation results | |
|---|---|---|---|---|
|  |  |  | solubility (min) | sensitivity (mJ/cm$^2$) |
| Example 1 | 10000 | 1.66 | 15 | 1.04 |
| Example 2 | 9900 | 1.65 | 15 | 1.10 |
| Comparative Example 1 | 10600 | 1.68 | 31 | 1.65 |
| Example 3 | 9600 | 1.74 | 16 | 1.05 |
| Comparative Example 2 | 9800 | 1.86 | 38 | 1.41 |

From the results of Table 10, the solubility of each polymer obtained in Examples 1, 2 and 3 was significantly improved in each polymer obtained in Comparative Examples 1 and 2. Also, the sensitivity of the resist composition containing the polymer obtained in Example 1, 2 or 3 was more improved than that of the resist composition containing the polymer obtained in Comparative Example 1 or 2.

Example 4 and Comparative Example 3

Monomers (m-1), (m-7) and (m-8) used in the synthesis of the following copolymers C-1 and C-2 are shown below.

[Chemical 3]

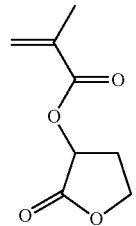
(m-1)

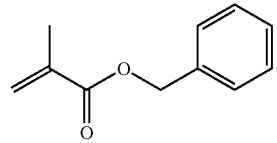
(m-7)

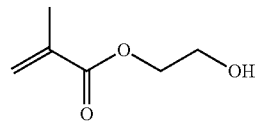
(m-8)

Comparative Example 3

A copolymer C-1 was synthesized in the following synthetic procedures.

A flask equipped with a nitrogen introduction port, a stirrer, a condenser, two dropping funnels and a temperature gauge was charged with 56.5 parts of PGME in a nitrogen atmosphere. The flask was bathed. Then, the bath temperature was raised to 80° C. while stirring the content in the flask.

Then, a dropping solution (total amount: 173.3 g) containing the following monomer mixture, a solvent and a polymerization initiator was prepared. Then, the solution was added dropwise at a fixed dropping rate in the flask by using the dropping funnel over 4 hours. Then, the flask was kept at 80° C. for 3 hours. The flask was cooled to ambient temperature to terminate the reaction 7 hours after the dropwise addition of the second solution was started.

Monomer m-1: 18.7 parts (24.4 mol %);
Monomer m-7: 18.7 parts (23.5 mol %);
Monomer m-8: 30.5 parts (52.1 mol %); and
PGME: 101.7 parts.
2,2'-azobisisobutyronitrile: 3.7 parts (5.0 mol % based on the total feed amount of the monomers).

Example 4

A copolymer C-2 was synthesized in the following synthetic procedures.

In this case, the following factors Fx, Fy and Fz were determined by the same procedures as in Reference Example 1 in the case where the target composition ratio (mol %) (m-1):(m-7):(m-8)=24.4:23.5:52.1. As a result, each factor was as follows: Fx(m-1)=1.17, Fy(m-7)=0.84, and Fz (m-8)= 1.02.

Using these factors and the above target composition ratio, the first composition ratio $x_0:y_0:z_0$ and the total mass ($W_0$) of the monomers existing in the reactor were determined.

$x_{0(m-1)}$=20.9 mol %
$y_{0(m-7)}$=28.0 mol %
$z_{0(m-8)}$=51.1 mol %

(Calculation of $W_0$)

The ratio ($W_0$) occupied by the total mass (6.40 parts from Table 6) of the monomers existing in the reactor 1 hour after the start of the dropwise addition in a monomer mixture was as follows: $W_0$=10.1% by mass.

(First Solution)
Monomer m-1: 1.8 parts (20.9 mol %);
Monomer m-7: 2.5 parts (28.0 mol %);
Monomer m-8: 3.3 parts (51.1 mol %); and
PGME (propylene glycol monomethyl ether): 56.5 parts.
(Second Solution)
Monomer m-1: 18.7 parts (24.4 mol %);
Monomer m-7: 18.7 parts (23.5 mol %);
Monomer m-8: 30.5 parts (52.1 mol %); and
PGME (propylene glycol monomethyl ether): 101.7 parts.
2,2'-azobisisobutyronitrile: 3.48 parts (4.24 mol % based on the total feed amount of the monomers).
(Polymerization Initiator Solution)
PGME (propylene glycol monomethyl ether): 17.7 parts; and
2,2'-azobisisobutyronitrile: 0.87 parts (1.06 mol % based on the total feed amount of the monomers)
<Synthesis of Copolymer C-2>

A flask equipped with a nitrogen introduction port, a stirrer, a condenser, two dropping funnels and a temperature gauge was charged with the mixture solution prepared in the above mixing ratio of the first solution in a nitrogen atmosphere. Then, the bath temperature was raised to 80° C. while stirring the content in the flask.

Then, the mixture solution prepared in the above mixing ratio of the second solution was added dropwise at a fixed dropping rate in the flask by using the dropping funnel over 6 hours. Then, the flask was kept at 80° C. for 1 hour.

The mixture solution prepared in the above mixing ratio of the polymerization initiator solution was added dropwise to the flask by using another dropping funnel over 0.5 hours simultaneously with the start of the dropwise addition of the mixture solution of the second solution. In this case, the weight-average molecular weight of a copolymer produced in the initial stage of the polymerization step varies corresponding to the amount of the polymerization initiator to be added dropwise to this step. However, it is designed so that the weight-average molecular weight is close to the target polymerization average molecular weight of each copolymer.

Then, IPE (diisopropyl ether) was prepared in an amount about 7 times that of the obtained reaction solution. Then, the reaction solution was added dropwise to the prepared IPE while stirring to obtain a white gel-like precipitate. Then, the obtained precipitate was separated by filtration.

Then, IPE (diisopropyl ether) was prepared in the same amount as that prepared in the above step. Then, the separated precipitate was poured into this mixture solvent. The precipitate was separated by filtration and recovered. Then, the precipitate was dried at 60° C. under reduced pressure for about 40 hours to obtain a powder of each copolymer.
(Weight-Average Molecular Weight of Copolymer for Lithography)

The weight-average molecular weight (Mw) and distribution of molecular weight (Mw/Mn) of each of the obtained copolymers C-1 and C-2 were measured in the following methods.

About 20 mg of a sample was dissolved in 5 mL of THF. Then, the solution was filtered through a 0.5-μm membrane filter to prepare a sample solution. Then, this sample solution was subjected to a gel permeation chromatography (GPC) apparatus (trade name: HCL-8220, manufactured by Tosoh Co., Ltd.) used to measure the weight-average molecular weight (Mw) and number-average molecular weight (Mn) and also the distribution of molecular weight (Mw/Mn). In this measurement, a column prepared by connecting three columns (trade name: Shodex GPC K-804 L, manufactured by Showa Denko K.K.) in series was used as the separation column. Also, THF (tetrahydrofuran) was used as a solvent. The flow rate was set to 1.0 mL/min. Also, a differential reflectometer was used as a detector. The measuring temperature was set to 40° C. Also, the amount of the sample solution to be injected was set to 0.1 mL. In addition, polystyrene was used as the standard polymer. The results of the measurement are shown in Table 11.

TABLE 11

|  |  | Mw | Mw/Mn | Solubility Transparency (%) |
|---|---|---|---|---|
| Comparative Example 3 | Copolymer C-1 | 9700 | 1.80 | 87 |
| Example 4 | Copolymer C-2 | 9500 | 1.73 | 99 |

(Evaluation of Solubility)

The copolymers C-1 and C-2 for lithography were respectively used to prepare a solution for evaluating solubility. The temperature of the solution was set to ambient temperature (25° C.). As an ultraviolet-visible absorptiometer, UV-3100 PC (trade name), manufactured by Shimadzu Corporation was used. The solution for measurement was placed in a quartz cuvette having an optical path length of 10 mm. The solubility was evaluated by a method of measuring transmittance having a wavelength of 450 nm. The higher the transmittance is, the better the solubility is. Also, a variation in lithographic performance in plane that is caused when the copolymer is applied to the substrate is more reduced with an increase in the above transmittance. The results are shown in Table 11.
(Preparation of Solution Used to Evaluate Solubility)

The following ingredients were blended to obtain a solution for evaluation.
Copolymer for lithography: 2.5 parts
Solvent 1 (PGME): 100 parts
Solvent 2 (IPE): 16 parts As shown by the results of Table 11, the value of the transmittance showing solubility ascends in the order of Copolymers 1 and 2. This confirmed that the lithographic performance of the copolymer C-2 (Example 4) produced by the production method of the present invention was superior to that of the copolymer C-1 (Comparative Example 3).

Copolymer for Lithography

Examples 5 to 7 and Comparative Examples 4 to 6

In Examples 5 to 7 and Comparative Examples 4 to 6, the following measuring methods and evaluation methods were used.
(Measurement of Weight-Average Molecular Weight)

The weight-average molecular weight (Mw) and distribution of molecular weight (Mw/Mn) of the polymer was determined as a value based on polystyrene by GPC under the following conditions (GPC condition).
(GPC Condition)
Apparatus: Tosoh High-Performance GPC apparatus (trade name), manufactured by Tosoh Co., Ltd.;

Separation column: column prepared by connecting three columns (trade name: Shodex GPC K-805 L, manufactured by Showa Denko K.K.) in series;
Measuring temperature: 40° C.;
Eluent: THF;
Sample: Solution obtained by dissolving about 20 mg of the copolymer in 5 mL of THF, and by filtering the solution by a 0.5-µm membrane filter;
Flow rate: 1 mL/min;
Injection amount: 0.1 mL
Detector: Differential reflectometer.
Calibration curve I: about 20 mg of standard polystyrene was dissolved in 5 mL of THF. Then, the solution was filtered through a 0.5-µm membrane filter. This solution was injected into the separation column in the above condition. Then, the relationship between the elution time and the molecular weight was determined. The following standard polystyrenes (all names are trade names) manufactured by Tosoh Co., Ltd. were each used as the standard polystyrene.

F-80 (Mw=706,000);
F-20 (Mw=190,000);
F-4 (Mw=37,900);
F-1 (Mw=10,200);
A-2500 (Mw=2,630),
A-500 (mixture of products: Mw=682, 578, 474, 370 and 260)

(Measurement of Average Monomer Composition of Copolymer)

About 5 parts by mass of the copolymer was dissolved in about 95 parts by mass of deuterated dimethyl sulfoxide to obtain a sample solution. This sample solution was placed in a NMR tube. Then, the sample solution was analyzed using $^1$H-NMR (manufactured by JEOL Ltd., resonance frequency: 270 MHz). The monomer composition ratio of the copolymer was calculated from the integral intensity ratio of signals derived from each constitutional unit.

(Division of Copolymer by GPC)

The copolymer was divided by GPC under the following conditions (GPC condition). Also, a solvent was distilled from a fraction solution first eluted to obtain a solid. This is a polymer having the highest molecular weight.

(GPC Condition)
Apparatus: Preparative LC (trade name: LC-9105, Japan Analytical Industry Co., Ltd.);
Separation column: column obtained by connecting JAI-GEL-2H and JAIGEL-3H (trade name), manufactured by Japan Analytical Industry Co., Ltd. in series;
Measuring temperature: 40° C.;
Eluent: THF
Sample: Solution obtained by dissolving about 1 g of the copolymer in 10 mL of THF, and by filtering the solution by a 0.5-µm membrane filter;
Flow rate: 1 mL/min;
Injection amount: 0.1 mL
Detector: Ultraviolet-visible absorptiometer and differential reflectometer.
Preparative method: Prepared by dividing an eluate showing peaks originated from the copolymer in an elution curve, into 8 fractions in order of elution such that each fraction has the same volume.

(Measurement of Fractionated Monomer Composition Ratio)

A fractionated monomer composition ratio in a high-molecular-weight fraction, which was first eluted among eight fractions prepared in the above method, was measured in the following method.

About 5 parts by mass of a solid obtained by distilling a solvent from the first eluted high-molecular-weight fraction was dissolved in about 95 parts by mass of deuterated dimethyl sulfoxide to prepare a sample solution. This sample solution was placed in a NMR tube. Then, the sample solution was analyzed using $^1$H-NMR (manufactured by JEOL Ltd., resonance frequency: 270 MHz). The monomer composition ratio of the copolymer was calculated from the integral intensity ratio of signals derived from each constitutional unit.

(Evaluation of the Solubility of the Copolymer)

20 parts of the copolymer and 80 parts of PGMEA were blended with each other. Then, the time taken to completely dissolve the copolymer was measured while stirring the mixture at 25° C. It was visually determined whether the copolymer was completely dissolved or not.

(Evaluation of the Sensitivity of the Resist Composition)

The resist composition was applied to a 6-inch silicon wafer with rotation. Then, the wafer was prebaked (PAB) at 120° C. on a hot plate for 60 seconds to form a resist film 300 nm in thickness. Using an ArF excimer laser exposure apparatus (trade name: VUVES-4500, manufactured by Litho Tech Japan Corporation), 18 shots having an area of 10 mm×10 mm were exposed to light at varied doses. Then, the resist film was post-baked (PEB) at 110° C. for 60 seconds. After that, using a resist developing analyzer (trade name: RDA-806, manufactured by Litho Tech Japan Corporation), the resist film was developed at 23.5° C. by an aqueous 2.38% tetramethylammonium solution for 65 seconds. The resist film exposed at each dose was measured to detect a variation in resist film thickness with time during developing.

The relationship between the logarithm of the exposure dose (unit:mJ/cm$^2$) and the proportion (unit:%, hereinafter referred to as a residual film ratio) of a residual film thickness with respect to the initial film thickness when the resist film was developed for 30 seconds was plotted based on the obtained data of the variation in film thickness with time, to make a dose-residual film ratio curve. Based on this curve, the value of the exposure dose (Eth) required to reduce the residual film ratio to 0% was determined. Specifically, the exposure dose (mJ/cm$^2$) at the point where the dose-residual film ratio curve crosses a line of 0% residual film ratio was determined as Eth. This Eth value indicates the sensitivity of the resist composition. As this value becomes smaller, the sensitivity of the resist composition becomes higher.

Example 5

Production of a Copolymer

In this example, the following monomers (m'-1), (m'-2) and (m'-3) were polymerized.

[Chemical 4]

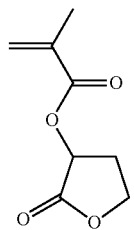

(m'-1)

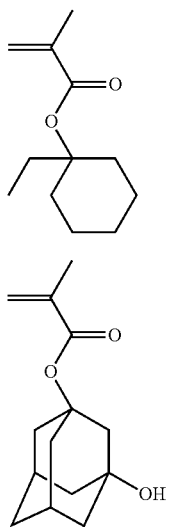

(m'-2)

(m'-3)

A flask equipped with a nitrogen introduction port, a stirrer, a condenser, a dropping funnel and a temperature gauge was charged with the following first solution in a nitrogen atmosphere. The flask was bathed. Then, the bath temperature was raised to 80° C. while stirring the content in the flask.

Then, the following polymerization initiator solution was added dropwise at a fixed rate in the flask from a dropping machine over 0.25 hours. The following second solution was added dropwise at a fixed rate from a dropping machine over 4 hours simultaneously with the start of the dropwise addition of the polymerization initiator. Then, the flask was kept at 80° C. for 3 hours.

The polymerization initiator to be fed to the reactor during a period (high-rate feeding period) in which the polymerization initiator is added dropwise is about 65% by mass of the total feed amount of the polymerization initiator.
(First Solution)
Monomer m'-1: 2.72 parts (32.26 mol %);
Monomer m'-2: 4.90 parts (50.48 mol %);
Monomer m'-3: 2.02 parts (17.26 mol %); and
Ethyl lactate: 79.0 parts.
(Second Solution)
Monomer m'-1: 23.80 parts (40.00 mol %);
Monomer m'-2: 27.44 parts (40.00 mol %);
Monomer m'-3: 16.52 parts (20.00 mol %);
Ethyl lactate: 98.06 parts; and
Dimethyl-2,2'-azobisisobutylate (trade name: V601, manufactured by Wako Pure Chemical Industries Ltd., the same as follows): 0.643 parts (0.700 mol % based on the total feed amount of the monomers).
(Polymerization Initiator Solution)
Ethyl lactate: 3.6 parts; and
Dimethyl-2,2'-azobisisobutylate: 1.196 parts (1.301 mol % based on the total feed amount of the monomers)

Then, the polymerization reaction solution in the flask was added dropwise to a mixture solvent of methanol and water (methanol/water=80/20 ratio by volume) having a volume ten times that of the reaction solution while stirring to obtain a white precipitate (copolymer A-1). The precipitate was separated by filtration. Then, the separated precipitate was again poured into a mixture solvent of methanol and water (methanol/water=90/10 ratio by volume) having the same amount as above. Then, the mixture was washed while stirring. Then, the washed precipitate was separated by filtration to obtain a wet polymer powder. The wet polymer powder was dried at 40° C. under reduced pressure for about 40 hours to obtain a white powder (66.0 g).

The obtained white powder was analyzed by $^1$H-NMR and GPC to find the average monomer composition, Mw and Mw/Mn of all copolymers.

Mw and Mw/Mn of the obtained copolymer A-1, the content ratio of each monomer in each of the average monomer composition and the fractionated monomer composition, and with regard to each monomer, a difference obtained by subtracting the content ratio of the average monomer composition from the content ratio of the fractionated monomer composition are shown in Table 12.

Also, the solubility of the obtained copolymer A-1 was evaluated by the above method. The results are shown in Table 12.

(Production of a Resist Composition)

2 parts of triphenylsulfonium triflate as a photoacid generator and 700 parts of PGMEA as a solvent were blended with 100 parts of the obtained copolymer A-1 to obtain a homogeneous solution. Then, this solution was filtered through a membrane filter having a pore size of 0.1 μm to prepare a resist composition solution. The sensitivity of the obtained resist composition was evaluated by the above method. The results are shown in Table 12.

Example 6

In this example, the following monomers (m'-4), (m'-5) and (m'-6) were polymerized.

[Chemical 5]

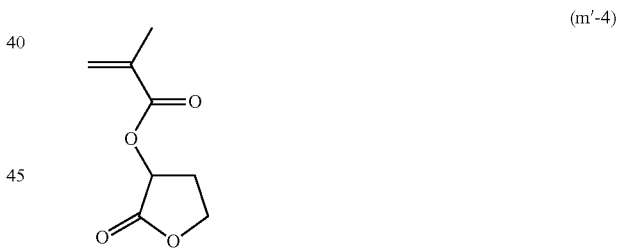

(m'-4)

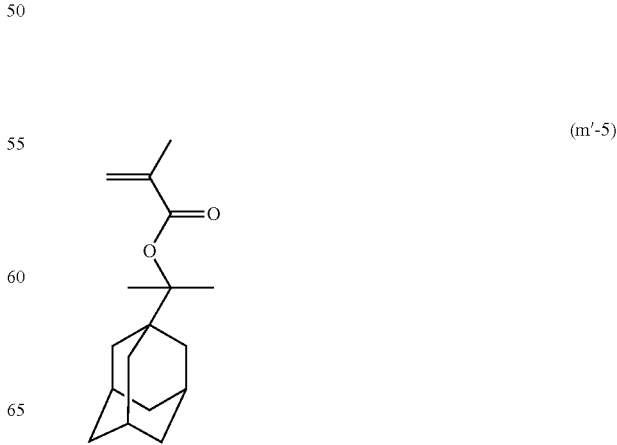

(m'-5)

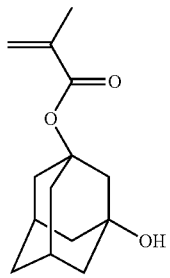

(m'-6)

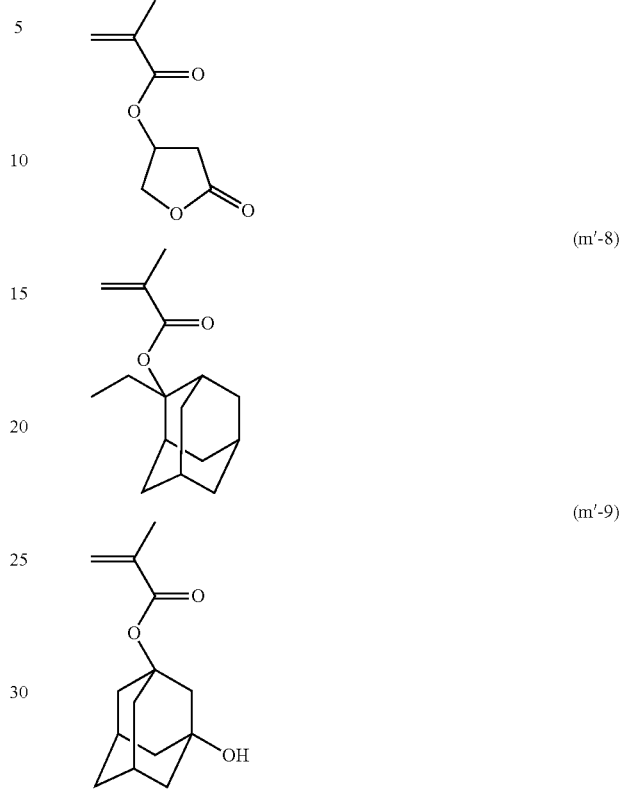

[Chemical 6]

The same flask that was used in Example 5 was charged with the following first solution in a nitrogen atmosphere. The flask was bathed. Then, the bath temperature was raised to 80° C. while stirring the content in the flask.

Then, the following polymerization initiator solution was added dropwise at a fixed rate in the flask from a dropping machine over 0.25 hours. The following second solution was added dropwise at a fixed rate from a dropping machine over 4 hours simultaneously with the start of the dropwise addition of the polymerization initiator. Then, the flask was kept at 80° C. for 3 hours.

In this example, the polymerization initiator to be fed to the reactor during a period (high-rate feeding period) in which the polymerization initiator is added dropwise is about 50% by mass of the total feed amount of the polymerization initiator.

(First Solution)
Monomer m'-4: 2.72 parts (49.40 mol %);
Monomer m'-5: 2.88 parts (33.99 mol %);
Monomer m'-6: 1.27 parts (16.61 mol %); and
PGMEA: 71.8 parts.
(Second Solution)
Monomer m'-4: 30.60 parts (55.56 mol %);
Monomer m'-5: 18.86 parts (22.22 mol %);
Monomer m'-6: 16.99 parts (22.22 mol %);
PGMEA: 96.1 parts; and
Dimethyl-2,2'-azobisisobutylate: 2.422 parts (2.955 mol % based on the total feed amount of the monomers).
(Polymerization Initiator Solution)
PGMEA: 3.6 parts; and
Dimethyl-2,2'-azobisisobutylate: 2.422 parts (2.955 mol % based on the total feed amount of the monomers).

Then, the polymerization reaction solution in the flask was added dropwise to a mixture solvent of methanol and water (methanol/water=85/15 ratio by volume) having a volume ten times that of the reaction solution while stirring to obtain a white precipitate (copolymer A-2). The precipitate was separated by filtration. Then, the separated precipitate was again poured into a mixture solvent of methanol and water (methanol/water=9/1 ratio by volume) having the same amount as above. Then, the mixture was washed while stirring. Then, the washed precipitate was separated by filtration to obtain a wet polymer powder. The wet polymer powder was dried at 40° C. under reduced pressure for about 40 hours to obtain a white powder (63.0 g).

The obtained white powder was measured and evaluated by the same procedures as in Example 5. The results are shown in Table 12.

Example 7

In this example, the following monomers (m'-7), (m'-8) and (m'-9) were polymerized.

The same flask that was used in Example 5 was charged with the following first solution in a nitrogen atmosphere. The flask was bathed. Then, the bath temperature was raised to 80° C. while stirring the content in the flask.

Then, the following polymerization initiator solution was added dropwise at a fixed rate in the flask from a dropping machine over 0.25 hours. The following second solution was added dropwise at a fixed rate from a dropping machine over 4 hours simultaneously with the start of the dropwise addition of the polymerization initiator. Then, the flask was kept at 80° C. for 3 hours.

In this example, the polymerization initiator to be fed to the reactor during a period (high-rate feeding period) in which the polymerization initiator is added dropwise is about 60% by mass of the total feed amount of the polymerization initiator.

(First Solution)
Monomer m'-7: 1.70 parts (17.92 mol %);
Monomer m'-8: 10.42 parts (75.34 mol %);
Monomer m'-9: 0.89 parts (6.74 mol %);
Ethyl lactate: 57.3 parts; and
PGMEA: 26.2 parts.
(Second Solution)
Monomer m'-7: 20.23 parts (41.17 mol %);
Monomer m'-8: 29.51 parts (41.17 mol %);
Monomer m'-9: 12.04 parts (17.66 mol %);
Ethyl lactate: 57.2 parts;
PGMEA: 30.8 parts; and
Dimethyl-2,2'-azobisisobutylate: 1.744 parts (2.199 mol % based on the total feed amount of the monomers).

(Polymerization Initiator Solution)
Ethyl lactate: 7.7 parts; and
Dimethyl-2,2'-azobisisobutylate: 2.569 parts (3.239 mol % based on the total feed amount of the monomers)

Then, the polymerization reaction solution in the flask was added dropwise to a mixture solvent of methanol and water (methanol/water=85/15 ratio by volume) having a volume ten times that of the reaction solution while stirring to obtain a white precipitate (copolymer A-3). Then, the precipitate was separated by filtration. Then, the separated precipitate was again poured into a mixture solvent of methanol and water (methanol/water=95/5 ratio by volume) having the same amount as above. Then, the mixture was washed while stirring. Then, the washed precipitate was separated by filtration to obtain a wet polymer powder. The wet polymer powder was dried at 40° C. under reduced pressure for about 40 hours to obtain a white powder (58.0 g).

The obtained copolymer A-3 was measured and evaluated by the same procedures as in Example 5. The results are shown in Table 12.

Comparative Example 4

In Example 5, a copolymer was synthesized without any monomer existing in advance in the flask. The molar ratio of the monomers used in this example is as follows: (m'-1):(m'-2):(m'-3)=40.00:40.00:20.00.

Specifically, the same flask that was used in Example 5 was charged with 64.5 parts of ethyl lactate in a nitrogen atmosphere. The flask was bathed. Then, the temperature of the bath was raised to 80° C. while stirring the content in the flask.

A solution containing 27.20 parts of the monomer (m'-1), 31.36 parts of the monomer (m'-2), 18.88 parts of the monomer (m'-3), 112.6 parts of ethyl lactate, and 2.576 parts of dimethyl-2,2'-azobisisobutylate (trade name: V601 mentioned above) was added dropwise at a fixed rate over 4 hours in the flask from a dropping machine containing the solution. The flask was kept at 80° C. for 3 hours.

After that, a white precipitate (copolymer B-1) was obtained by the same procedures as in Example 5. The precipitate was then separated by filtration. Then, the separated precipitate was washed. After being washed, the precipitate was separated by filtration. The obtained precipitate was dried to obtain a white powder (64.0 g).

The obtained copolymer B-1 was measured and evaluated by the same procedures as in Example 5. The results are shown in Table 12.

Comparative Example 5

In Example 6, a copolymer was synthesized without any monomer existing in advance in the flask. The molar ratio of the monomers used in this example is as follows: (m'-4):(m'-5):(m'-6)=55.56:22.22:22.22.

Specifically, the same flask that was used in Example 5 was charged with 61.5 parts of PGMEA in a nitrogen atmosphere. The flask was bathed. Then, the temperature of the bath was raised to 80° C. while stirring the content in the flask.

A solution containing 34.00 parts of the monomer (m'-4), 20.96 parts of the monomer (m'-5), 18.88 parts of the monomer (m'-6), 110.76 parts of PGMEA, and 8.197 parts of dimethyl-2,2'-azobisisobutylate (trade name: V601 mentioned above) was added dropwise at a fixed rate over 4 hours in the flask from a dropping machine containing the solution. The flask was kept at 80° C. for 3 hours.

After that, a white precipitate (copolymer B-2) was obtained by the same procedures as in Example 6. The precipitate was then separated by filtration. Then, the separated precipitate was washed. After being washed, the precipitate was separated by filtration. The obtained precipitate was dried to obtain a white powder (63.0 g).

The obtained copolymer B-2 was measured and evaluated by the same procedures as in Example 5. The results are shown in Table 12.

Comparative Example 6

In Example 7, a copolymer was synthesized without any monomer existing in advance in the flask. The molar ratio of the monomers used in this example is as follows: (m'-7):(m'-8):(m'-9)=41.17:41.17:17.66.

Specifically, the same flask that was used in Example 5 was charged with 42.4 parts of ethyl lactate, 18.2 parts of PGMEA in a nitrogen atmosphere. The flask was bathed. Then, the temperature of the bath was raised to 80° C. while stirring the content in the flask.

A solution containing 23.80 parts of the monomer (m'-7), 34.72 parts of the monomer (m'-8), 14.16 parts of the monomer (m'-9), 76.3 parts of ethyl lactate, 32.7 parts of PGMEA, and 5.083 parts of dimethyl-2,2'-azobisisobutylate (trade name: V601 mentioned above) was added dropwise at a fixed rate over 4 hours in the flask from a dropping machine containing the solution. The flask was kept at 80° C. for 3 hours.

After that, a white precipitate (copolymer B-3) was obtained by the same procedures as in Example 7. The precipitate was then separated by filtration. Then, the separated precipitate was washed. After being washed, the precipitate was separated by filtration. The obtained precipitate was dried to obtain a white powder (57.0 g).

The obtained copolymer B-3 was measured and evaluated by the same procedures as in Example 5. The results are shown in Table 12.

TABLE 12

| Copolymer | | | Example | | | Comparative Example | | |
|---|---|---|---|---|---|---|---|---|
| | | | A-1 | A-2 | A-3 | B-1 | B-2 | B-3 |
| Weight-average molecular weight (Mw) | | | 10500 | 9600 | 6500 | 10600 | 9800 | 7400 |
| Molecular weight distribution | | | 1.59 | 1.58 | 1.55 | 1.64 | 1.70 | 1.60 |
| Content ratio (mol %) of constitutional units in monomer composition | m'-1 | Average monomer composition ratio | 40.1 | | | 40.7 | | |
| | | Fraction monomer composition ratio | 39.2 | | | 43.0 | | |
| | | Difference (fraction − average) ratio | −0.9 | | | 2.3 | | |
| | m'-2 | Average monomer composition ratio | 40.3 | | | 35.5 | | |
| | | Fraction monomer | 40.7 | | | 38.9 | | |

TABLE 12-continued

| Copolymer | | Example | | | Comparative Example | | |
|---|---|---|---|---|---|---|---|
| | | A-1 | A-2 | A-3 | B-1 | B-2 | B-3 |
| | composition ratio | | | | | | |
| | Difference (fraction − average) ratio | 0.4 | | | 3.4 | | |
| m'-3 | Average monomer composition ratio | 19.2 | | | 20.4 | | |
| | Fraction monomer composition ratio | 20.5 | | | 21.5 | | |
| | Difference (fraction − average) ratio | 1.3 | | | 1.1 | | |
| m'-4 | Average monomer composition ratio | | 59.6 | | | 58.0 | |
| | Fraction monomer composition ratio | | 58.3 | | | 61.0 | |
| | Difference (fraction − average) ratio | | −1.3 | | | 3.0 | |
| m'-5 | Average monomer composition ratio | | 22.4 | | | 21.2 | |
| | Fraction monomer composition ratio | | 20.4 | | | 17.4 | |
| | Difference (fraction − average) ratio | | −2.0 | | | −3.8 | |
| m'-6 | Average monomer composition ratio | | 20.5 | | | 22.3 | |
| | Fraction monomer composition ratio | | 21.2 | | | 21.6 | |
| | Difference (fraction − average) ratio | | 0.7 | | | −0.7 | |
| m'-7 | Average monomer composition ratio | | | 38.2 | | | 41.8 |
| | Fraction monomer composition ratio | | | 39.0 | | | 44.0 |
| | Difference (fraction − average) ratio | | | 0.8 | | | 2.2 |
| m'-8 | Average monomer composition ratio | | | 44.1 | | | 39.5 |
| | Fraction monomer composition ratio | | | 41.7 | | | 36.4 |
| | Difference (fraction − average) ratio | | | −2.4 | | | −3.1 |
| m'-9 | Average monomer composition ratio | | | 17.7 | | | 18.7 |
| | Fraction monomer composition ratio | | | 20.3 | | | 22.8 |
| | Difference (fraction − average) ratio | | | 2.6 | | | 4.1 |
| Solubility (min) | | 17 | 25 | 12 | 31 | 38 | 18 |
| Sensitivity (mJ/cm$^2$) | | 1.32 | 2.23 | 0.54 | 1.61 | 2.89 | 0.79 |

As is shown by the results in Table 12, the weight-average molecular weight of the copolymer A-1 obtained in Example 5 is almost equal to the weight-average molecular weight of the copolymer B-1 obtained in Comparative Example 1. However, the distribution of molecular weight of A-1 is smaller than that of B-1. Also, in the case of A-1, the difference between the fractionated monomer composition ratio and the average monomer composition ratio is in a range from −3 mol % to +3 mol %. This fits to any of the constitutional units derived from the monomers (m'-1), (m'-2) and (m'-3). With regard to the copolymer B-1, on the other hand, the difference between the fractionated monomer composition ratio and average monomer composition ratio of a part of the constitutional units exceeds the range from −3 mol % to +3 mol %. Also, the copolymer A-1 is outstandingly superior to the copolymer B-1 in solubility and sensitivity.

Also, the same tendency is determined in the case of comparing the copolymer A-2 obtained in Example 6 with the copolymer B-2 obtained in Comparative Example 5 and also in the case of comparing the copolymer A-3 obtained in Example 7 with the copolymer B-3 obtained in Comparative Example 6.

INDUSTRIAL APPLICABILITY

The present invention can provide a method for producing a polymer which can improve a variation in the content ratio of constitutional components and in molecular weight in a copolymer, and also in solubility in a solvent and in sensitivity when used for a resist composition, a polymer obtained by the above production method and used for lithography, and a resist composition containing the polymer used for lithography and a method for producing a substrate with a pattern formed thereon by using the resist composition.

DESCRIPTION OF REFERENCE SIGNS

B Baseline
S Peak start
E Peak end

The invention claimed is:
1. A polymerization method, the method comprising:
(I) feeding a first solution to a reactor, wherein the feeding (I) occurs before or simultaneously with the start of a dropwise addition of a polymerization initiator to the reactor, and the first solution comprises two or more monomers $\alpha_1$ to $\alpha_n$ in a first composition ratio;

(II) feeding a second solution to the reactor, wherein the feeding (II) occurs after or simultaneously with the start of the feeding (I) of the first solution, wherein:

n denotes an integer of 2 or more;

the monomers $\alpha_1$ to $\alpha_n$ are polymerized while the monomers $\alpha_1$ to $\alpha_n$ and the polymerization initiator are added dropwise to the reactor to obtain a copolymer comprising constitutional units $\alpha'_1$ to $\alpha'_n$, wherein $\alpha'_1$ to $\alpha'_n$ represent constitutional units derived from the monomers $\alpha_1$ to $\alpha_n$;

the first composition ratio is such that the monomers $\alpha_1$ to $\alpha_n$ are reacted in a steady state based on respective reaction rates of the monomers $\alpha_1$ to $\alpha_n$;

when a target composition ratio (in mol %), which is represented by a constant ratio of the constitutional units $\alpha'_1$ to $\alpha'_n$, of the copolymer is $\alpha'_1:\alpha'_2:\ldots:\alpha'_n$, the second solution comprises the monomers $\alpha_1$ to $\alpha_n$ having the same composition ratio as the target composition ratio, and wherein the first composition ratio is determined by:

(i) adding dropwise at a fixed dropping rate, to a reactor containing a solvent, a dropping solution comprising 100 parts by mass of a monomer mixture having the same monomer composition ratio as the target composition ratio, $\alpha'_1:\alpha'_2:\ldots:\alpha'_n$, the polymerization initiator; and the solvent, wherein a composition ratio (in mol %) $M_1:M_2:\ldots:M_n$ of the monomers $\alpha_1$ to $\alpha_n$ remaining in the reactor is calculated when a passage of time from the start of the dropwise addition is $t_1, t_2, t_3 \ldots$, and $t_m$, and a ratio (in mol %) $P_1:P_2:\ldots:P_n$ of the constitutional units $\alpha'_1$ to $\alpha'_n$ of each polymer formed, between the time $t_1$ to the time $t_2$, time $t_2$ to the time $t_3, \ldots$, and time $t_m$ to the time $t_{m+1}$ is calculated;

(ii) determining a time zone from $t_m$ to $t_{m+1}$ when the ratio $P_1:P_2:\ldots:P_n$ becomes nearest to the target composition ratio $\alpha'_1:\alpha'_2:\ldots:\alpha'_n$, wherein m represents an integer of 1 or more; and (iii) determining factors $F_1, F_2, \ldots,$ and $F_n$ from the value of the ratio $P_1:P_2:\ldots:P_n$ between $t_m$ and $t_{m+1}$ and the value of the composition ratio $M_1:M_2:\ldots:M_n$ at the passage of time $t_m$ based on equations $F_1=P_1/M_1, F_2=P_2/M_2, \ldots,$ and $Fn=P_n/M_n$, wherein: $\alpha_1=\alpha'_1/F_1, \alpha_2=\alpha'_2/F_2, \ldots, \alpha_n=\alpha'_n/F_n$; and (III) feeding the polymerization initiator to the reactor, wherein the polymerization initiator is added dropwise at a rate higher than an average feed rate Vj during a high-rate feeding period which occurs at an early stage of the polymerization, the average feed rate Vj is defined as a value obtained by dividing a total feed amount of the polymerization initiator by a standard time, the high-rate feeding period of the polymerization initiator is defined as a period from 0% to j %, wherein j is 5 to 20, of the standard time, and the standard time is defined as a passage of time from a beginning of the dropwise addition of the polymerization initiator to a completion of a dropwise addition of the second solution (II).

2. The method of claim 1, wherein:

the feeding (II), which is a dropwise addition of the second solution, is started after or simultaneously with the start of the dropwise addition of the polymerization initiator to the reactor;

$\alpha_1:\alpha_2:\ldots:\alpha_n$ represents the first composition ratio (in mol %);

the feeding of the first solution (I) is completed before 20% of the standard time passes;

the polymerization initiator is fed in an amount of 30 to 90% by mass of a total feed amount thereof during the high-rate feeding period and the first composition ratio is determined by:

(i) adding dropwise, at a fixed dropping rate, to a reactor containing a solvent:

a dropping solution comprising 100 parts by mass of a monomer mixture having the same monomer composition ratio as the target composition ratio, $\alpha'_1:\alpha'_2:\ldots:\alpha'_n$;

the polymerization initiator; and the solvent, wherein a composition (in: mol %) $M_1:M_2:\ldots:M_n$ of the monomers $\alpha_1$ to $\alpha_n$ remaining in the reactor is calculated when a passage of time from the start of the dropwise addition is $t_1, t_2, t_3 \ldots$, and $t_m$, and a ratio (in: mol %) $P_1:P_2:\ldots:P_n$ of the constitutional units $\alpha'_1$ to $\alpha'_n$ of each polymer, formed between the time $t_1$ to the time $t_2$, between the time $t_2$ to the time $t_3, \ldots$, and between the time $t_m$ to the time $t_{m+1}$, is calculated;

(ii) determining a time zone from $t_m$ to $t_{m+1}$ when the ratio $P_1:P_2:\ldots:P_n$ becomes nearest to the target composition ratio $\alpha'_1:\alpha'_2:\ldots:\alpha'_n$, wherein m represents an integer of 1 or more; and (iii) determining factors $F_1, F_2, \ldots,$ and $F_n$ from the value of the ratio $P_1:P_2:\ldots:P_n$ between $t_m$ and $t_{m+1}$ and the value of the composition ratio $M_1:M_2:\ldots:M_n$ at the passage of time $t_m$ based on equations $F_1=P_1/M_1, F_2=P_2/M_2, \ldots,$ and $F_n=P_n/M_n$, wherein $\alpha_1=\alpha'_1/F_1, \alpha_2=\alpha'_2/F_2, \ldots, \alpha_n=\alpha'_n/F_n$.

3. The method of claim 1, wherein the rate of dropwise addition of the polymerization initiator is changed during a course of the high-rate feeding period.

4. The method of claim 1, wherein the rate of dropwise addition of the polymerization initiator is changed after an end of the high-rate feeding period.

5. The method of claim 1, wherein the polymerization initiator is added continuously.

6. The method of claim 1, wherein the polymerization initiator is added intermittently.

* * * * *